United States Patent
Yamaguchi et al.

(10) Patent No.: US 10,622,404 B2
(45) Date of Patent: Apr. 14, 2020

(54) IMAGING DEVICE, MANUFACTURING METHOD, AND SUBSTRATE DIVIDING METHOD

(71) Applicant: SONY SEMICONDUCTOR SOLUTIONS CORPORATION, Kanagawa (JP)

(72) Inventors: Masanari Yamaguchi, Tokyo (JP); Taizo Takachi, Kanagawa (JP); Shunsuke Furuse, Nagasaki (JP); Takashi Oinoue, Nagasaki (JP); Yuki Ikebe, Oita (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 150 days.

(21) Appl. No.: 15/740,958

(22) PCT Filed: Jul. 19, 2016

(86) PCT No.: PCT/JP2016/003370
§ 371 (c)(1),
(2) Date: Dec. 29, 2017

(87) PCT Pub. No.: WO2017/017926
PCT Pub. Date: Feb. 2, 2017

(65) Prior Publication Data
US 2018/0197906 A1    Jul. 12, 2018

(30) Foreign Application Priority Data

Jul. 24, 2015   (JP) .................................. 2015-147145
Jun. 22, 2016   (JP) .................................. 2016-123597

(51) Int. Cl.
*H01L 27/146*    (2006.01)

(52) U.S. Cl.
CPC .... *H01L 27/1469* (2013.01); *H01L 27/14627* (2013.01); *H01L 27/14634* (2013.01); *H01L 27/14643* (2013.01); *H01L 27/14687* (2013.01)

(58) Field of Classification Search
CPC ........... H01L 27/1469; H01L 27/14627; H01L 27/14634; H01L 27/14643; H01L 27/14687
See application file for complete search history.

(56) References Cited

U.S. PATENT DOCUMENTS 7,566,635 B2 *   7/2009  Fujii ........................ B28D 5/00
                                                    438/462
8,969,752 B2 *   3/2015  Fukumitsu ............. B28D 1/221
                                                    219/121.16
(Continued)

FOREIGN PATENT DOCUMENTS

JP      2012-129797        7/2012
JP      2013-021533        1/2013

OTHER PUBLICATIONS

International Search Report and Written Opinion prepared by the European Patent Office dated Oct. 3, 2016, for International Application No. PCT/JP2016/003370.

*Primary Examiner* — Douglas M Menz
(74) *Attorney, Agent, or Firm* — Sheridan Ross P.C.

(57) ABSTRACT

There is provided semiconductor devices and methods of forming the same, including: a first substrate; and a second substrate adjacent to the first substrate, where a side wall of the second substrate includes one or more diced portions that can include a blade diced portion and a stealth diced portion; and also imaging devices and methods of forming the same, including: a first substrate; a transparent layer; an adhesive layer between the first substrate and the transparent layer; a second substrate, where the first substrate is disposed (Continued)

between the adhesive layer and the second substrate; and a groove extending from the adhesive layer to the second substrate, where the groove is filled with the adhesive layer.

11 Claims, 25 Drawing Sheets

(56) References Cited

U.S. PATENT DOCUMENTS

| | | | |
|---|---|---|---|
| 2009/0068798 A1* | 3/2009 | Oliver | H01L 27/14618 438/127 |
| 2011/0147782 A1 | 6/2011 | Sano et al. | |
| 2012/0161308 A1 | 6/2012 | Chu et al. | |
| 2013/0215309 A1 | 8/2013 | Yukawa | |
| 2014/0191352 A1 | 7/2014 | Wang et al. | |

* cited by examiner

IMAGING DEVICE, MANUFACTURING METHOD, AND SUBSTRATE DIVIDING METHOD

CROSS-REFERENCE TO RELATED APPLICATIONS

This application is a national stage application under 35 U.S.C. 371 and claims the benefit of PCT Application No. PCT/JP2016/003370 having an international filing date of 19 Jul. 2016, which designated the United States, which PCT application claimed the benefit of Japanese Priority Patent Application JP 2015-147145 filed on Jul. 24, 2015, and JP 2016-123597 filed on Jun. 22, 2016 the entire contents of which are incorporated herein by reference.

TECHNICAL FIELD

The presently disclosed technology relates to an imaging device, a manufacturing method, and a substrate method. More particularly, the present disclosure relates to an imaging device, a manufacturing method, and a substrate dividing method that can improve moistureproof performance.

BACKGROUND ART

Recently, an imaging apparatus in which a plurality of charge coupled devices (CCD), a plurality of complementary metal-oxide semiconductor (CMOS) devices, or the like are arranged in a two-dimensional shape is used as a digital video camera, a digital still camera, or the like.

As a method realizing simultaneous accumulation of electric charges in a CMOS image sensor, a global shutter structure having a structure for temporarily storing a signal in a memory is disclosed in the prior art. The global shutter structure is configured such that exposure times of all pixels are synchronized with each other by disposing a memory in each pixel, transferring electric charges accumulated in light-receiving portions of all the pixels in a batch manner, and storing the electric charges until reading is performed for each row (see PTL 1 and 2).

CITATION LIST

Patent Literature

PTL 1: JP 2012-129797 A
PTL 2: JP 2013-21533 A

SUMMARY OF INVENTION

Technical Problem

Imaging devices are manufactured by manufacturing a plurality of imaging devices on a substrate and segmenting (dicing) the substrate at the time of manufacture. In this segmentation, there is a possibility that film peeling, cracking, or other problems will occur. Due to occurrence of film peeling, cracking, or other problems, there is a possibility that water will infiltrate into the imaging device and cause dew condensation, thereby causing deterioration in image quality.

It is desirable to maintain and improve moistureproof performance during and after manufacturing an imaging device.

The technology disclosed herein is made in consideration of the above-mentioned circumstances and is designed to improve moistureproof performance, among other advantages.

Solution to Problem

According to various embodiments of the present disclosure, there is provided a semiconductor device, including: a first substrate; and a second substrate adjacent to the first substrate, where a side wall of the second substrate includes a blade diced portion and a stealth diced portion.

Various embodiments may include an imaging device where the first substrate is disposed between a transparent layer and the second substrate.

Various embodiments may include an imaging device further including an adhesive layer between the first substrate and the transparent layer.

Various embodiments may include an imaging device further including a groove that extends from the adhesive layer to the second substrate.

Various embodiments may include an imaging device where the transparent layer is a cover glass layer and the adhesive layer is resin.

Various embodiments may include an imaging device where the stealth diced portion and the blade diced portion extend to the groove.

Various embodiments may include an imaging device where the stealth diced portion is further from the groove than the blade diced portion.

According to further various embodiments of the present disclosure, there is provided an imaging device, including: a first substrate; a transparent layer; an adhesive layer between the first substrate and the transparent layer; a second substrate, where the first substrate is disposed between the adhesive layer and the second substrate; and a groove extending from the adhesive layer to the second substrate, where the groove is filled with the adhesive layer.

Various embodiments may include an imaging device where the adhesive layer is a resin.

Various embodiments may include an imaging device where the transparent layer is a cover glass layer.

Various embodiments may include an imaging device further including a microlens layer and a wiring layer, where the groove extends through the microlens layer and through the wiring layer such that the adhesive layer is in contact with the microlens layer, the wiring layer, and the first substrate.

Various embodiments may include an imaging device where a side wall of the second substrate includes a blade diced portion, and where a width of the groove is greater than a width of a blade in contact with the blade diced portion.

Various embodiments may include an imaging device further including a solder resist disposed on a bottom of the second substrate.

According to still further various embodiments of the present disclosure, there is provided an imaging device, including: a transparent layer; a first substrate, the first substrate including photoelectric conversion sections; a second substrate, where the first substrate is disposed between the transparent layer and the second substrate; and a microlens layer including microlenses that focus incident light to the photoelectric conversion sections, where the second substrate includes a first diced portion and a second diced portion.

Various embodiments may include an imaging device further including an adhesive layer between the first substrate and the transparent layer.

Various embodiments may include an imaging device further including a groove that extends from the adhesive layer to the second substrate, where the groove is filled with the adhesive layer.

Various embodiments may include an imaging device further including a wiring layer, further including a wiring layer, where the groove extends through the microlens layer and through the wiring layer.

Various embodiments may include an imaging device where the groove extends such that the adhesive layer is in contact with the microlens layer, the wiring layer, and the first substrate, and further various embodiments may include an imaging device where the adhesive layer is a resin.

Various embodiments may include an imaging device where a width of the groove is greater than a width of a blade that is in contact with the first diced portion and the second diced portion.

Advantageous Effects of Invention

According to various aspects of the technology disclosed herein, it is possible to improve moistureproof performance among other advantages.

The above-mentioned advantages are not restrictive, and other advantageous effects may be achieved.

DESCRIPTION OF EMBODIMENTS

Hereinafter, illustrative forms for putting the presently disclosed technology into practice (hereinafter, referred to as embodiments) will be described. The description will be made in the following order.

1. Configuration of Solid-State Imaging Device
2. Structure of Chip
3. First Embodiment
4. Second Embodiment
5. Third Embodiment
6. Fourth Embodiment
7. Segmentation Using Optical Laser
8. Segmentation Using Stealth Dicing
9. Electronic Apparatus <Illustrative Configuration of Solid-State Imaging Device>

Figure 1:
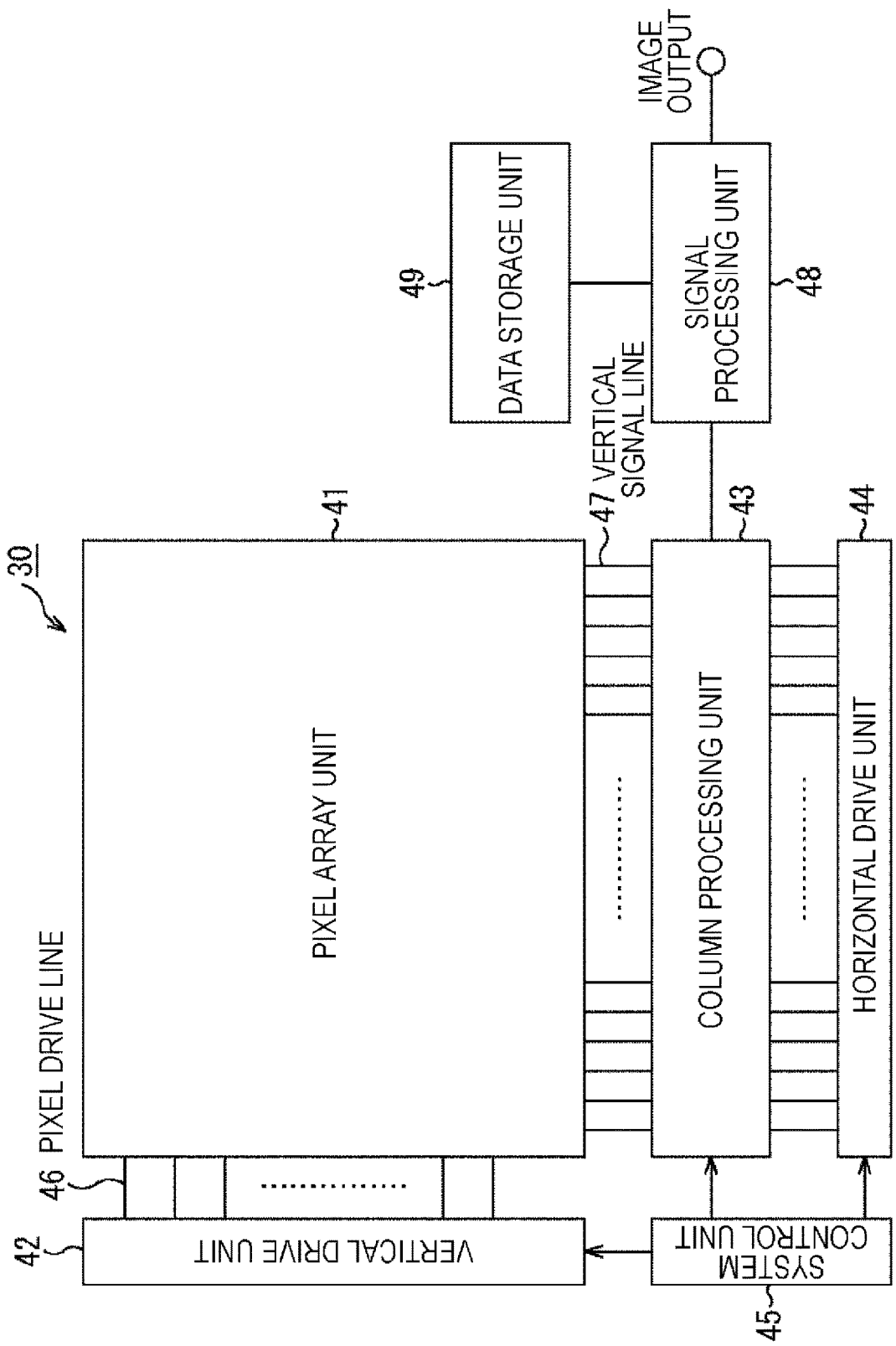
FIG. 1 is an illustrative block diagram showing a configuration example of a CMOS image sensor.

FIG. 1 is an illustrative block diagram showing a configuration example of a complementary metal oxide semiconductor (CMOS) image sensor as a solid-state imaging device according to embodiments of the present disclosure.

In various embodiments, a CMOS image sensor 30 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) which is not illustrated.

In the pixel array unit 41, unit pixels having a photoelectric conversion element generating an amount of photocharges corresponding to incident light intensity and storing therein are two-dimensionally arranged in a matrix shape. In the following description, the amount of photocharges corresponding to incident light intensity is simply referred to as "charges" and the unit pixel may be simply referred to as "pixel".

In the pixel array unit 41, a pixel drive line 46 is formed in the right-left direction (a pixel arrangement direction in a pixel row) in the drawing for each row in the pixel array in a matrix shape, and a vertical signal line 47 is formed in the vertical direction (a pixel arrangement direction in a pixel column) in the drawing for each column. An end of the pixel drive line 46 is connected to an output terminal corresponding to each row of the vertical drive unit 42.

The CMOS image sensor 30 includes a signal processing unit 48 and a data storage unit 49. The signal processing unit 48 and the data storage unit 49 may be embodied by an external signal processing unit disposed on a substrate different from that of the CMOS image sensor 30, for example, a digital signal processor (DSP) or a software process, or may be mounted on the same substrate as the CMOS image sensor 30.

The vertical drive unit 42 is a pixel drive unit that is constituted by a shift register, an address decoder, or the like and drives the pixels of the pixel array unit 41 simultaneously for all the pixels or for each row. Although its detailed configuration is not illustrated, the vertical drive unit 42 is configured to include, for example, a reading scan system and a sweeping scan system or to have a batch sweeping function and a batch transfer function.

The reading scan system sequentially and selectively scans the unit pixels of the pixel array unit 41 for each row to read signals from the unit pixels. In a row driving operation (rolling shutter operation), a sweeping scan operation is performed on a reading row which is subjected to a reading scan operation by the reading scan system earlier by the time corresponding to a shutter speed than the reading scan operation. In a global exposure operation (global shutter operation), the batch sweeping operation may be performed at a time corresponding to the shutter speed rather than the batch transfer operation.

By this sweeping operation, unnecessary charges are swept out (reset) from the photoelectric conversion elements of the unit pixels of the reading row. A so-called electronic shutter operation is performed by sweeping out (resetting) the unnecessary charges. Here, the electronic shutter operation refers to an operation for discharging the photocharges of the corresponding photoelectric conversion element and starting new exposures (starting accumulation of photocharges).

A signal read through the reading operation of the reading scan system corresponds to incident light intensity in the previous reading operation or after the electronic shutter operation. In the row driving operation, a period from the reading timing in the previous reading operation or the sweeping timing in the electronic shutter operation to the reading timing in the present reading operation is a period (exposure period) in which photocharges are accumulated in the unit pixel. In the global exposure operation, the period from the batch sweeping to the batch transfer is an accumulation period (exposure period).

Pixel signals output from the unit pixels in the pixel row, which is selectively scanned by the vertical drive unit 42, are supplied to the column processing unit 43 via the vertical signal lines 47, respectively. The column processing unit 43 performs a predetermined signal process on the pixel signals output from the unit pixels of the selected row via the vertical signal lines 47 for each pixel column of the pixel array unit 41, and temporarily stores the pixel signals subjected to the signal process.

Specifically, the column processing unit 43 performs at least a noise removing process, for example, a correlated double sampling (CDS) process, as the signal process. By the correlated double sampling process of the column processing unit 43, reset noise or fixed-pattern noise specific to the pixels, such as threshold unevenness of amplification transistors, is removed. The column processing unit 43 may be provided with, for example, an analog-digital (AD) conversion function in addition to the noise removing process and may output a signal level as a digital signal.

The horizontal drive unit 44 is constituted by a shift register, an address decoder, or the like and sequentially selects the unit pixels corresponding to the pixel column of the column processing unit 43. By the selective scanning of the horizontal drive unit 44, the pixel signals processed by the column processing unit 43 are sequentially output to the signal processing unit 48.

The system control unit 45 includes a timing generator generating various timing signals and controls the driving of the vertical drive unit 42, the column processing unit 43, the horizontal drive unit 44, and the like based on various timing signals generated from the timing generator.

The signal processing unit 48 has at least an addition processing function and performs various signal processes, such as an adding process on the pixel signals output from the column processing unit 43. The data storage unit 49 temporarily stores necessary data in processing the signals in the signal processing unit 48.

<Illustrative Structure of Chip>

Embodiments of specific structures of the unit pixels which are arranged in a matrix shape in the pixel array unit 41 in FIG. 1 will be described below. A pixel having the presently disclosed technology applied thereto can, for example, improve its moistureproof performance and can improve its performance as a sensor. To explain these exemplary advantageous effects, a pixel not having the presently disclosed technology applied thereto will be first described and then a pixel having the presently disclosed technology applied thereto will be described.

Figure 2:
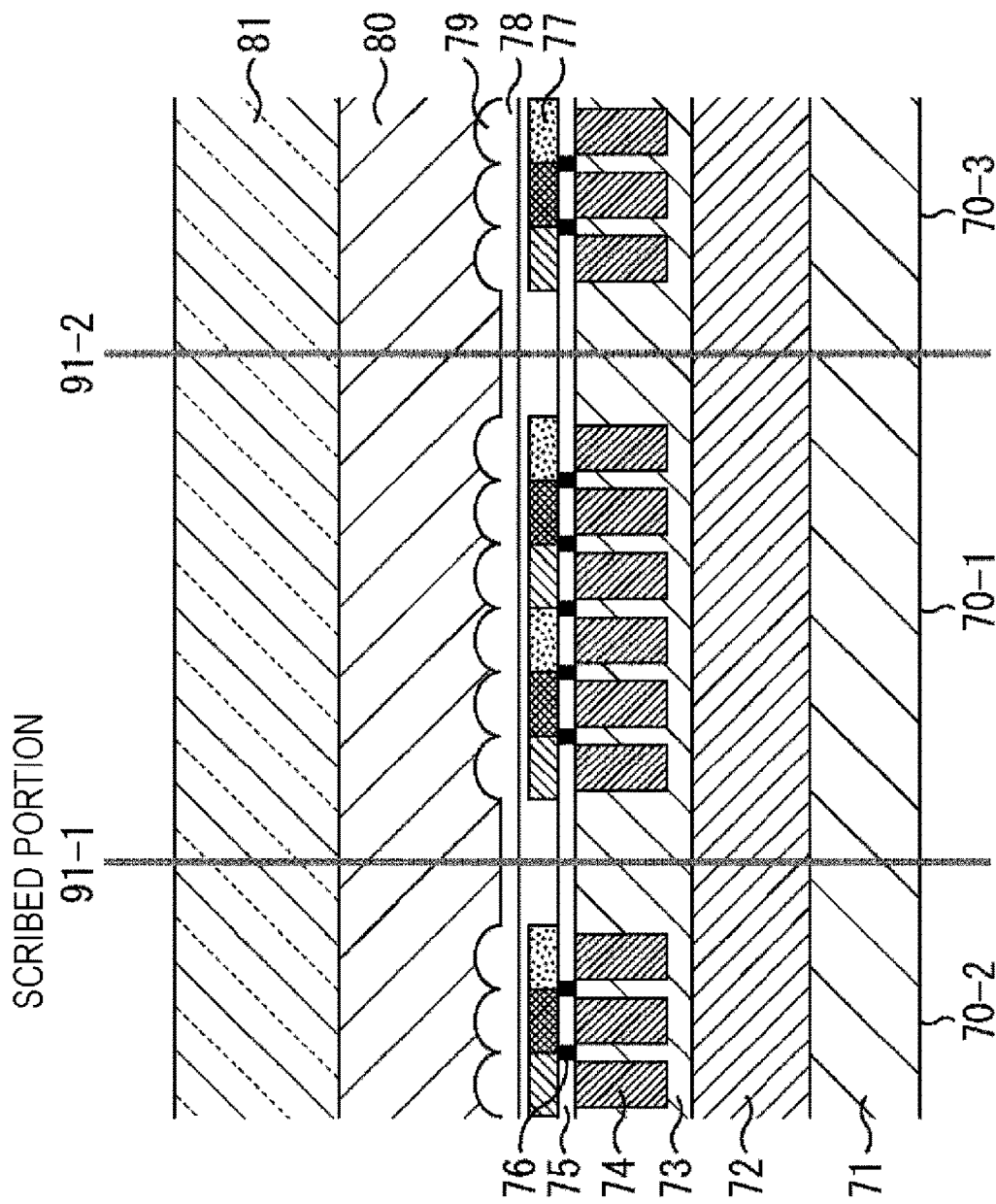
FIG. 2 is an illustrative diagram showing a configuration of a unit pixel.

FIG. 2 shows an illustrative configuration example of a chip in which a plurality of unit pixels are arranged. The chip illustrated in FIG. 2 constitutes a backside-irradiation CMOS image sensor before being segmented.

The configuration illustrated in FIG. 2 described below is only an example and the presently disclosed technology described herein can be applied to other configurations, for example, a configuration in which another layer is added in addition to layers described below or layers are deleted from the layers described below.

In various illustrative embodiments, in a chip 70 illustrated in FIG. 2, a wiring layer 72 formed of an insulating layer and metal is disposed on a support substrate 71, and a silicon substrate 73 is disposed on the wiring layer 72. The support substrate 71 is formed of silicon, glass epoxy, glass, plastic, or another suitable material. In the silicon substrate 73, a plurality of photodiodes 74 (optical elements) as the photoelectric conversion portion of each pixel are formed at predetermined intervals.

A flattening film 75 formed of an insulator is formed on the silicon substrate 73 and the photodiodes 74. In the flattening film 75, a light-blocking film 76 for preventing light from leaking into a neighboring pixel is formed between the neighboring photodiodes 74.

A color filter layer 77 is formed on the flattening film 75 and the light-blocking film 76. The color filter layer 77 is provided with a plurality of color filters for each pixel and the colors of the color filters are arranged, for example, based on the Bayer array.

A flattening film 78 is formed on the color filter layer 77. A microlens layer 79 is formed on the flattening film 78. In this way, the microlens layer 79 is disposed on the substrate having a plurality of layers including the photodiodes 74. In the microlens layer 79, a microlens layer for focusing light on the photodiode 74 of each pixel is formed for each pixel. The microlens layer 79 is an inorganic material layer and is formed of SiN, SiO, SiOxNy (where $0<x\leq1$ and $0<y\leq1$ are satisfied).

A cover glass 81 is bonded to the top of the microlens layer 79 with an adhesive layer 80 interposed therebetween. The cover glass 81 is not limited to glass, but may employ a transparent plate of a resin or the like. The adhesive layer 80 is formed of an acryl-based resin material, a styrene-based resin material, an epoxy-based resin material, or the like.

In the chip 70 illustrated in FIG. 2, a plurality of chips are present. FIG. 2 illustrates a wafer state in which three chips are present in the horizontal direction before being diced. In the wafer illustrated in FIG. 2, the chip located at the center is referred to as a chip 70-1, the chip located on the left side is referred to as a chip 70-2, and the chip located on the right side is referred to as a chip 70-3.

A scribed portion 91-1 is disposed between the chip 70-1 and the chip 70-2, and a scribed portion 91-2 is disposed between the chip 70-1 and the chip 70-3. The chips illustrated in FIG. 2 are segmented into three chips by performing a dicing process on the scribed portion 91-1 and the scribed portion 91-2.

Figure 3:
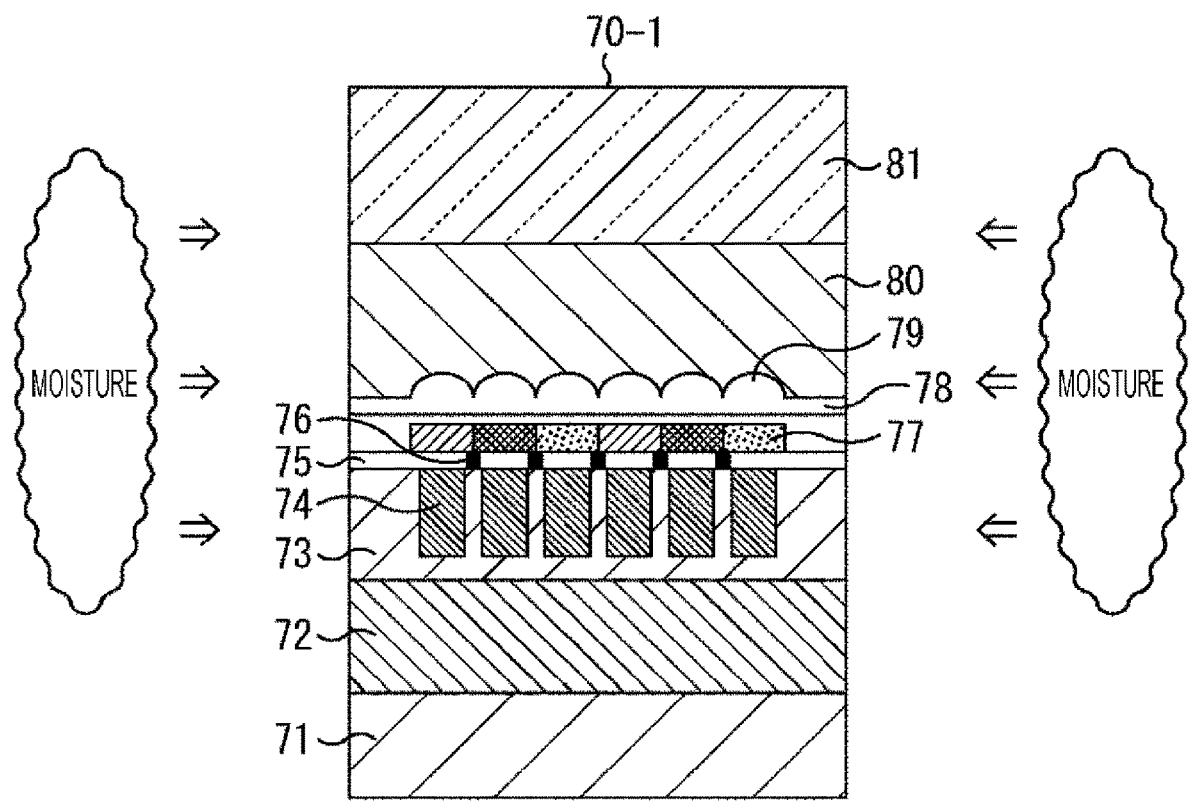
FIG. 3 is an illustrative diagram showing an influence of moisture.

FIG. 3 illustrates the segmented chip 70-1. The chip 70-1 illustrated in FIG. 3 is a chip located at the center of the chip illustrated in FIG. 2 and is the chip 70-1 segmented by performing a dicing process on the scribed portion 91-1 and the scribed portion 91-2.

At the time of dicing, there is a possibility that an edge will be peeled off by a physical force applied to the chip 70-1 at the time of dicing. After dicing, there is a possibility that moisture will be infiltrated into the side surface or another area of the chip 70-1. For example, the possibility that a part of a sealing resin will absorb moisture is higher than that of other parts. There is also a possibility that moisture will be infiltrated into an interface portion, for example between the sealing resin and the glass, or another interface.

When moisture is infiltrated into the chip 70-1, a metal material may corrode and cause breakage or other damage depending on the infiltration position and there is a possibility that the chip will not operate normally or optimally. For example, there is a possibility that image unevenness or display failure will occur. Accordingly, it is advantageous to perform a dicing operation so as not to cause damage, such as peeling or other damage, at the time of dicing and to provide structures that advantageously prevent or reduce moisture from being infiltrated into the chip 70-1.

Structures and manufacturing processes capable of preventing or reducing damage, such as peeling or other damage, from occurring at the time of dicing to prevent or reduce moisture that could otherwise be infiltrated into the chip 70 are described below. The chips according to the various embodiments may have the configuration illustrated in FIGS. 2 and 3, and parts useful for explaining the various embodiments are appropriately illustrated and described.

First Embodiment

A first embodiment is an embodiment in which damage at the time of dicing or infiltration of moisture into a chip is prevented or reduced by forming a groove in a predetermined layer in the chip.

Figure 4:
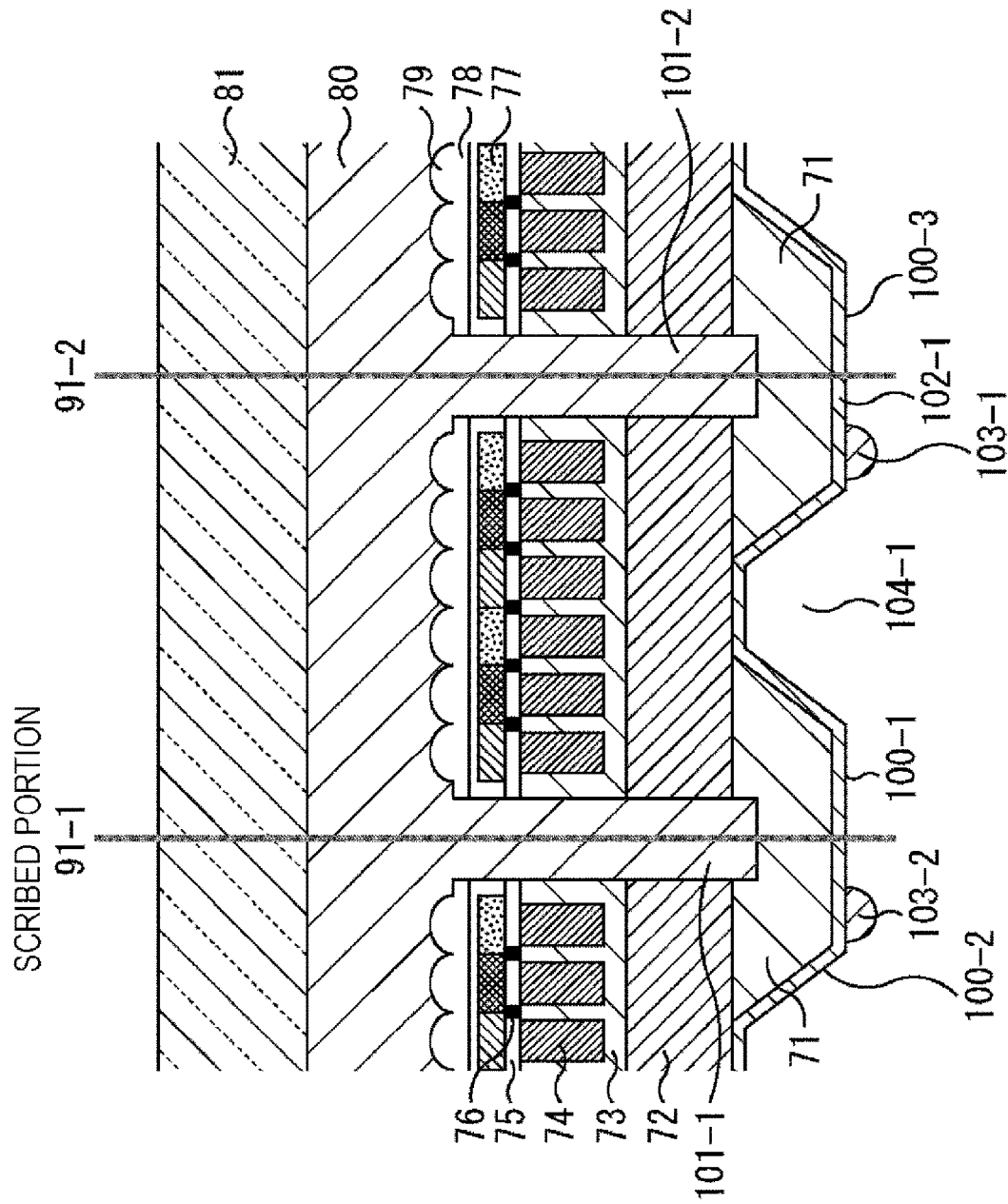
FIG. 4 is an illustrative diagram showing a configuration of a chip according to a first embodiment.

FIG. 4 shows an illustrative configuration of the chip according to the first embodiment. FIG. 4 illustrates a wafer state in which a plurality of chips (e.g., three chips in FIG. 4) are present before being diced, (e.g., as illustrated in FIG. 2). Each chip is a cavityless chip-size package (CSP).

Here, the chip located at the center is referred to as a chip 100-1, the chip located on the left side is referred to as a chip 100-2, and the chip located on the right side is referred to as a chip 100-3. In the following description, when it is not necessary to individually distinguish the chips 100-1 to 100-3, the chips are simply referred to as the chip 100.

Each chip 100 may have the same configuration as the chip 70 described above with reference to FIGS. 2 and 3. That is, in the chip 100, a wiring layer 72 is disposed on a support substrate 71, and a silicon substrate 73 is disposed on the wiring layer 72. In the silicon substrate 73, a plurality of photodiodes 74 (optical elements) as a photoelectric conversion portion of each pixel are formed at predetermined intervals.

A flattening film 75 is formed on the silicon substrate 73, and a light-blocking film 76 for preventing light from leaking into neighboring pixels is formed between the neighboring photodiodes 74 in the flattening film 75. A color filter layer 77 is formed on the flattening film 75. A flattening film 78 is formed on the color filter layer 77. A microlens layer 79 is formed on the flattening film 78. A cover glass 81 is bonded to the top of the microlens layer 79 with an adhesive layer 80 interposed therebetween.

The adhesive layer 80 can be a member that is formed of a transparent resin and can fix the cover glass 81. The cover glass 81 may not be glass but may be a plate-like transparent member.

A solder resist 102 and a connection terminal 103 for connection to an external circuit are also formed on the bottom of the support substrate 71. A penetration electrode 104-1 such as a through silicon via (TSV) is also formed and the penetration electrode 104-1, the connection terminal 103, and the wiring layer 72 are connected to each other.

The wafer illustrated in FIG. 4 is provided with a groove 101 between the chips 100. The groove 101-1 is disposed between the chip 100-1 and the chip 100-2 and the groove 101-2 is disposed between the chip 100-1 and the chip 100-3.

A scribed portion 91-1 is disposed between the chip 100-1 and the chip 100-2, and the groove 101-1 is disposed in the scribed portion 91-1. Similarly, a scribed portion 91-2 is disposed between the chip 100-1 and the chip 100-3, and the groove 101-2 is disposed in the scribed portion 91-2.

In the chip 100 illustrated in FIG. 4, the groove 101 is disposed to dig into the microlens layer 79, the flattening film 78, the color filter layer 77, the flattening film 75, the silicon substrate 73, the wiring layer 72, and a part of the top portion of the support substrate 71.

As will be described later, since the grooves 101 are formed before the adhesive layer 80 is formed and the adhesive layer 80 is formed after the grooves 101 are formed, the grooves 101 are filled with the same material as the adhesive layer 80. The material used for the adhesive layer 80 can be a transparent resin. The grooves 101 can be filled with the transparent resin.

Figure 5:
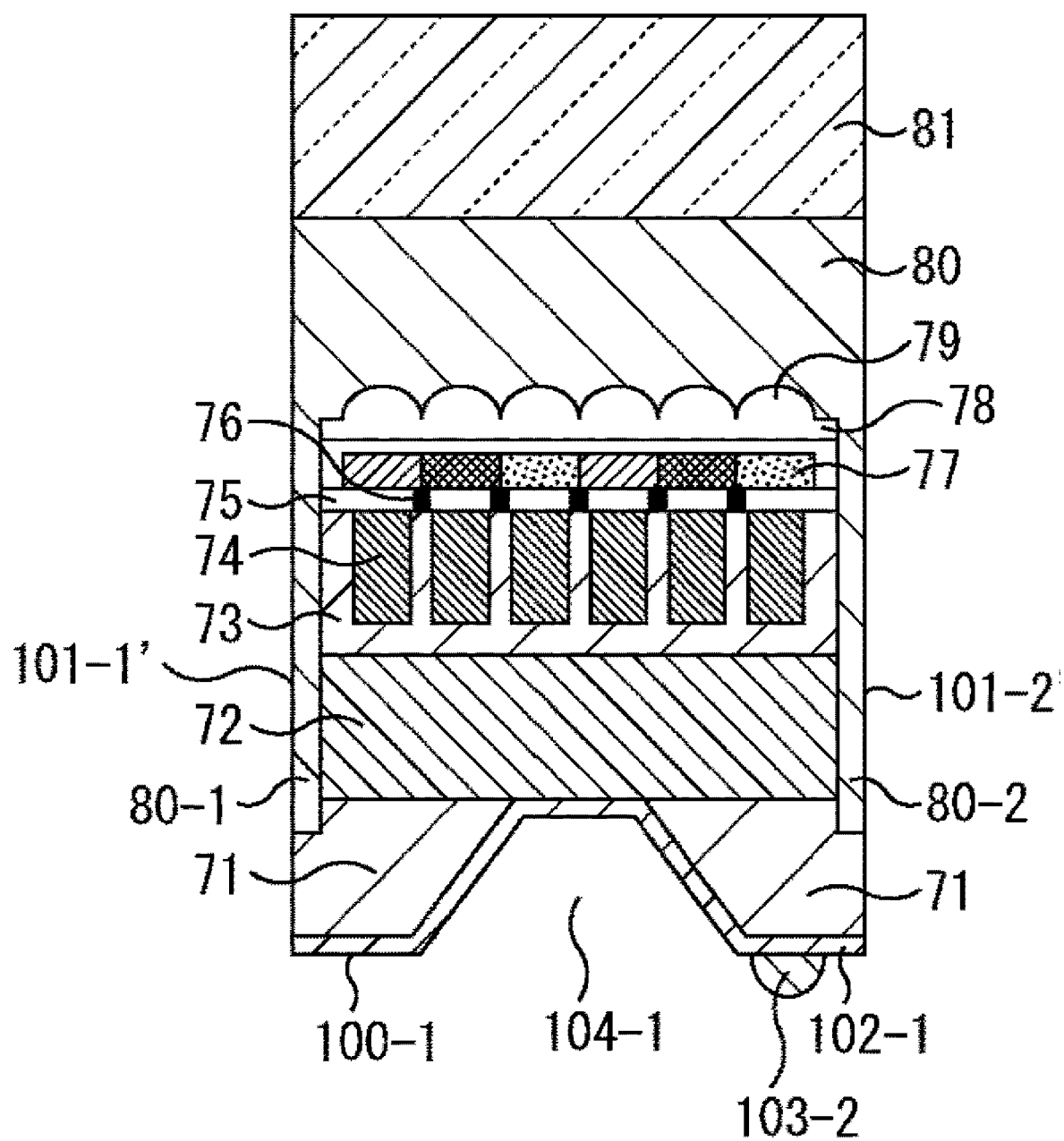
FIG. 5 is an illustrative diagram showing a configuration of the chip according to the first embodiment.

When a wafer in which the grooves 101 are disposed between chips 100 is diced at the scribed portions 91, the chip 100-1 as illustrated in FIG. 5 is cut out. In the chip 100-1 illustrated in FIG. 5, the microlens layer 79, the flattening film 78, the color filter layer 77, the flattening film 75, the silicon substrate 73, the wiring layer 72, and a part of the support substrate 71 are surrounded by the adhesive layer 80 such that their surfaces are not exposed.

That is, the side surfaces of the microlens layer 79, the flattening film 78, the color filter layer 77, the flattening film 75, the silicon substrate 73, the wiring layer 72, and a part of the support substrate 71 are covered with the same material as the adhesive layer 80.

In this way, the segmented chip 100-1 has a structure in which parts of the stacked layers of the chip 100 are covered at the positions of the groove 101-1' and the groove 101-2' (the grooves after being diced are denoted by adding an apostrophe to the reference numerals thereof to distinguish them from the grooves 101-1 and 101-2 before being diced as illustrated in FIG. 4).

In this way, in various embodiments, in order to obtain a structure in which the grooves 101-1' and 101-2' remain in the segmented chip 100-1 and the same material as the adhesive layer 80 remains in those parts, the width of the groove 101-1 or the groove 101-2 between the chips 100 before being segmented may be preferably set to be larger than the width of a blade which is used for the dicing process.

In this way, by performing the dicing process in a state in which the grooves 101 are formed and are filled with the same material as the adhesive layer 80, it is possible to reduce a force applied to the interfaces between the films at the time of dicing and to reduce a possibility that film peeling or cracking or other damage will occur. Since the film peeling or the cracking does not occur or is reduced, it is possible to improve moistureproof performance of the chip.

Since a solder resist 102-1 is disposed on the bottom of the chip 100-1, it is possible to prevent or reduce water from infiltrating into the chip 100-1 from the bottom. An oxide film may be used instead of the solder resist 102-1, and/or an oxide film may be stacked on the solder resist 102-1.

Manufacturing of Chip in First Embodiment

Figure 6:
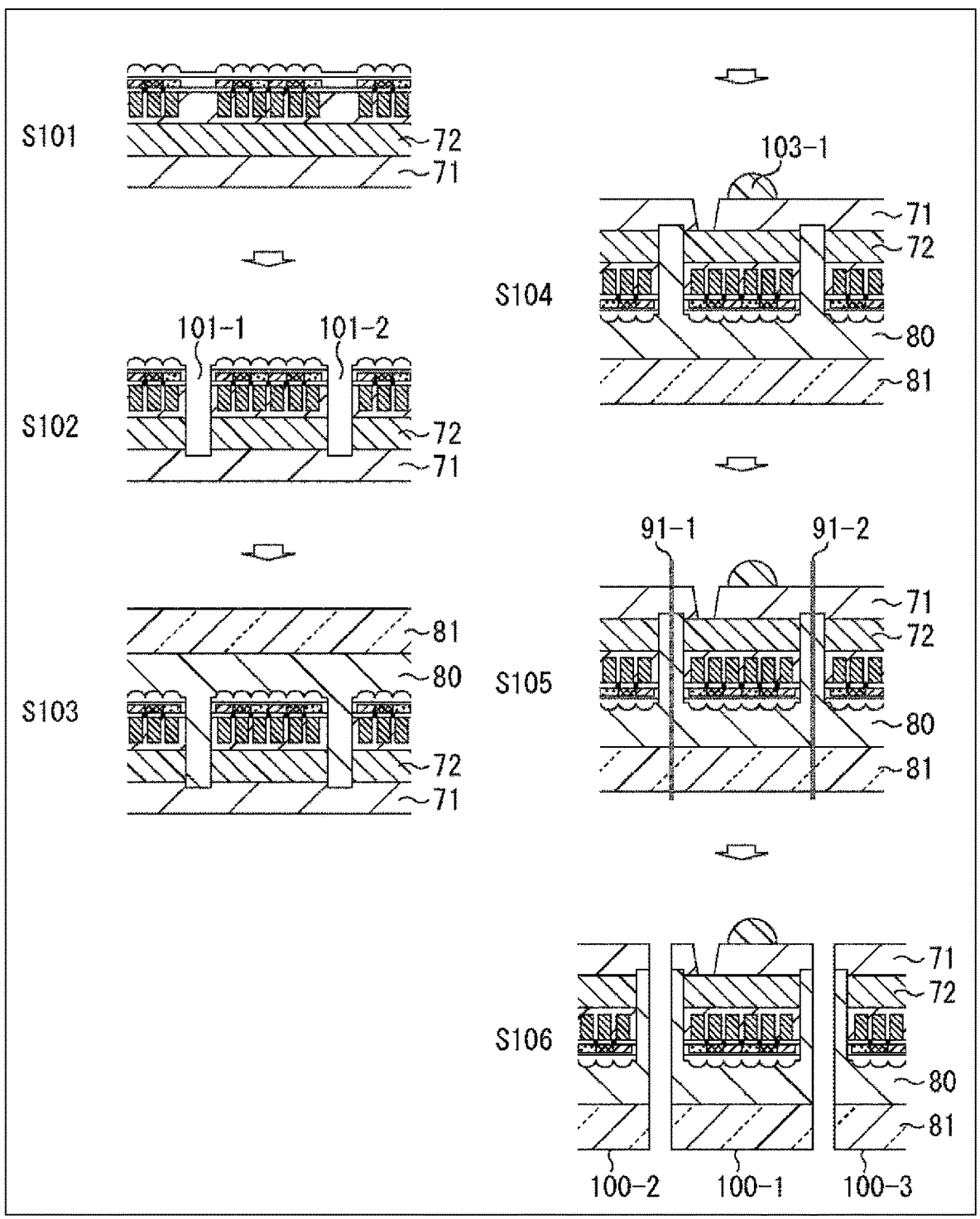
FIG. 6 is an illustrative diagram showing manufacturing of the chip according to the first embodiment.

Illustrative methods of manufacturing chips (wafers) having the above-mentioned grooves will be described. FIG. 6 is a diagram showing an illustrative process of manufacturing a chip before being segmented.

Regarding the illustrative manufacturing process which will be described with reference to FIG. 6, the process of forming a groove which is a feature of the presently disclosed technology will be described, and processes of manufacturing the other portions, for example, processes of forming layers, can be performed using conventional manufacturing methods and thus description thereof will be appropriately omitted.

In step S101, a semiconductor wafer having photodiodes 74 and other elements formed therein is prepared. Thus, the semiconductor wafer has, for example, the support substrate 71, the wiring layer 72, the silicon substrate 73, the flattening film 75, the color filter layer 77, the flattening film 78, and the microlens layer 79 stacked, with the photodiodes 74 formed in the silicon substrate 73, and the light-blocking film 76 formed in the flattening film 75.

In step S102, the groove 101-1 and the groove 101-2 are formed in the semiconductor wafer. The grooves 101 are formed at the positions corresponding to the scribed portions 91 as described herein. The grooves 101 are formed, for example, by laser ablation or half-cut dicing. The grooves 101 are formed, for example, by laser ablation or half-cut dicing or a combination thereof.

In step S102, the layers up to (or up through) the wiring layer 72 are removed. For example, layers including the wiring layer 72 may be removed, and layer including the wiring layer 72 and a portion of the support substrate 71 may be removed. By first removing the wiring layer 72 from the sensor surface (the photodiode 74 side), it is possible to remove a part that serves as a start point of cracking by dicing after the CSP (e.g., step S104, described later). Accordingly, it is possible to advantageously suppress occurrence of cracking, among other problems.

When a low-k material (material having a low dielectric constant) is used for the wiring layer 72, damage can be easily caused when using blade dicing and it may be necessary to perform the removal by laser ablation (LA). When the LA process is performed after step S103 which is a subsequent step, the resin constituting the adhesive layer 80 serving as a protective film may be modified by heat of the LA process. However, by performing the LA process before the resin is applied, it is possible to prevent the modification.

In some illustrative embodiments, the width of the formed grooves 101 is set to be larger than the width of the blade which is used for the dicing process. The depth of the formed grooves 101 is set to a depth that does not expose the adhesive layer 80 filled in the grooves 101 at the time of decreasing the thickness of the support substrate 71 in the subsequent step and is set to the depth of a shallow portion of the support substrate 71 as described herein.

In step S103, the adhesive layer 80 is formed. In forming the adhesive layer 80, the grooves 101 are filled with the same material as the material constituting the adhesive layer 80, for example, a resin. The adhesive layer 80 is formed using a coating method, or a lamination method, or a similar method. In step S103, the semiconductor wafer is bonded to the cover glass 81. It is preferable, in various embodiments, that the bonding be performed using a vacuum bonding machine such that bubbles are not infiltrated into the bonding surface. Since the bonding is performed at the wafer level, a large flap or the like does not occur and the CSP processes described later are not affected by any large flap or the like.

In step S104, a connection terminal 103-1 is formed and the CSP process is performed. Although not entirely illustrated, the penetration electrode 104 is formed by etching to open wiring parts of multilayer wires formed on the surface of the semiconductor wafer, an insulating film such as a silicon oxide film is formed, the insulating film in through-holes is etched and opened, penetration electrodes are formed in the through-holes, for example, by Cu plating, and wires are formed on the surface (rear surface) opposite to a light-transmitting substrate in the semiconductor wafer. A step of decreasing the thickness of the support substrate 71 may be performed before this step.

In step S105, by performing the dicing process at the scribed portions 91, the semiconductor wafer is segmented into chips (step S106).

By forming the grooves 101 and forming the adhesive layer 80 (resin layer) in the grooves 101 in this way, it is possible to improve the moistureproof performance.

By forming the grooves 101, stacking the adhesive layer 80 on the grooves 101, and performing the dicing process at the positions as discussed, it is possible to reduce a force applied to interfaces between the films at the time of dicing and to reduce a possibility that damage, such as film peeling or cracking, will occur.

Since the possibility that film peeling or cracking or other problems that would occur can be reduced, it is possible to improve the moistureproof performance of the chip.

Second Embodiment

Figure 7:
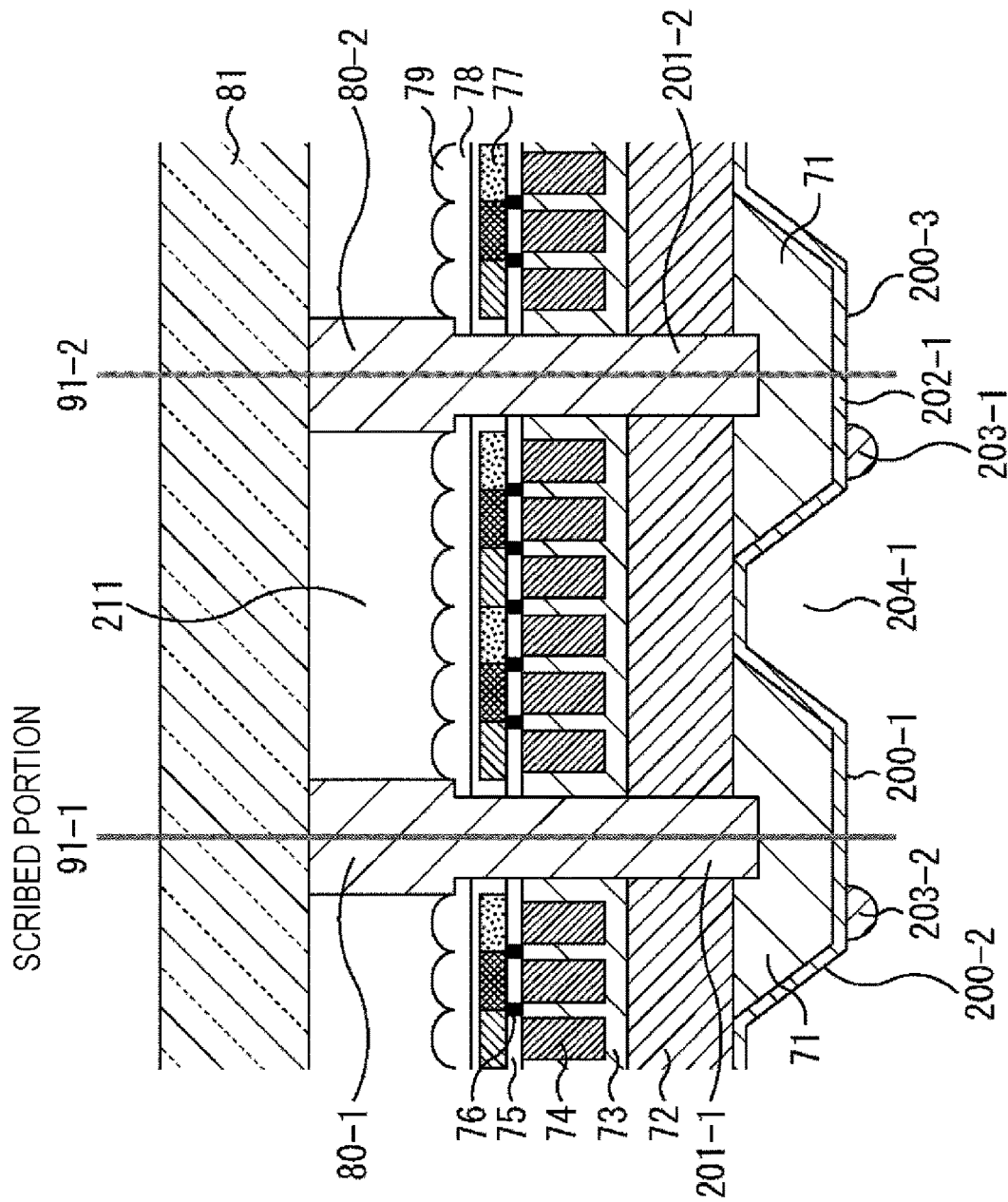
FIG. 7 is an illustrative diagram showing a configuration of a chip according to a second embodiment.

FIG. 7 shows another illustrative configuration of a chip according to a second embodiment. FIG. 7 illustrates a wafer state in which a plurality of chips (e.g., three chips in FIG. 7) are present as illustrated in FIG. 4 before being diced.

Here, the chip located at the center is referred to as a chip 200-1, the chip located on the left side is referred to as a chip 200-2, and the chip located on the right side is referred to as a chip 200-3. In the following description, when it is not necessary to individually distinguish the chips 200-1 to 200-3, the chips are simply referred to as the chip 200.

Each chip 200 has the same configuration as the chip 100 described above with reference to FIG. 4, but both chips are different from each other in that the adhesive layer 80 is not present on the microlens layer 79. The chip 100 according to the first illustrative embodiment is a chip size package (CSP) having a cavityless structure, but the chip 200 according to the second illustrative embodiment is a CSP having a cavity structure.

As the CSP has a cavity structure, as illustrated in FIG. 7, a space layer 211 is disposed between the microlens layer 79 and the cover glass 81 of the chip 200.

The wafer illustrated in FIG. 7 is provided with a groove 201 between the chips 200. The groove 201-1 is disposed between the chip 200-1 and the chip 200-2 and the groove 201-2 is disposed between the chip 200-1 and the chip 200-3.

A scribed portion 91-1 is disposed between the chip 200-1 and the chip 200-2, and the groove 201-1 is disposed in the scribed portion 91-1. Similarly, a scribed portion 91-2 is disposed between the chip 200-1 and the chip 200-3, and the groove 201-2 is disposed in the scribed portion 91-2.

In the chip 200 illustrated in FIG. 7, the groove 201 is disposed to dig into the microlens layer 79, the flattening film 78, the color filter layer 77, the flattening film 75, the silicon substrate 73, the wiring layer 72, and a shallow part of the top portion of the support substrate 71.

An adhesive layer 80 formed of the same material as the adhesive layer 80 in the first embodiment is formed in the grooves 201.

Regarding the adhesive layer 80, as the chip 200 has a cavity structure, the space layer 211 is present instead of the adhesive layer 80, and is formed by forming the adhesive layer 80, leaving a part thereof, and forming the space layer 211 in the other part that is described later in the manufacturing process.

By forming the adhesive layer 80-1 in the groove 201-1, the adhesive layer 80-1 can be formed on the side surfaces of the space layer 211, the microlens layer 79, the flattening film 78, the color filter layer 77, the flattening film 75, the silicon substrate 73, the wiring layer 72, and a part of the support substrate 71.

By forming the adhesive layer 80-2 in the groove 201-2, the adhesive layer 80-2 can be formed on the side surfaces of the space layer 211, the microlens layer 79, the flattening film 78, the color filter layer 77, the flattening film 75, the silicon substrate 73, the wiring layer 72, and a part of the support substrate 71.

Figure 8:
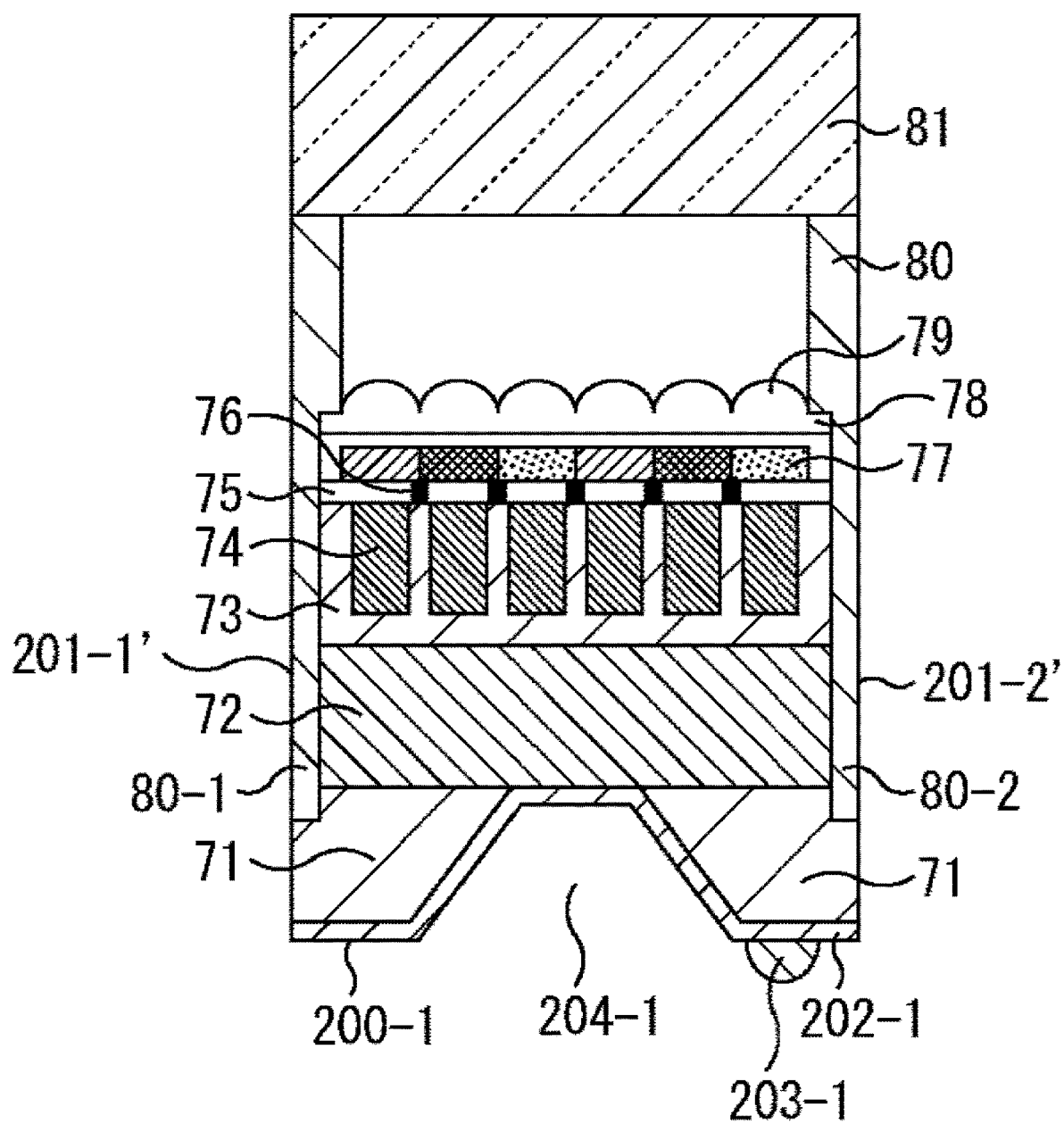
FIG. 8 is an illustrative diagram showing a configuration of the chip according to the second embodiment.

When a wafer in which the grooves 201 are disposed between chips 200 is diced at the scribed portions 91, the chip 200-1 illustrated in FIG. 8 is cut out. In the chip 200-1 illustrated in FIG. 8, the space layer 211, the microlens layer 79, the flattening film 78, the color filter layer 77, the flattening film 75, the silicon substrate 73, the wiring layer 72, and a partial wall surface of the support substrate 71 are covered with the adhesive layer 80 and the surfaces are not exposed.

In this way, the segmented chip 200-1 has a structure in which parts of the stacked layers of the chip 200-1 are covered with the adhesive layer 80-1 formed at the positions of the groove 201-1' (the grooves after being diced are denoted by adding an apostrophe to the reference numerals thereof to distinguish them from the groove 201-1 before being diced as illustrated in FIG. 7).

The segmented chip 200-1 has a structure in which parts of the stacked layers of the chip 200-1 are covered with the adhesive layer 80-2 formed at the positions of the groove 201-2'.

In this way, both ends (or side surfaces, for example) of the chip 200-1 are covered (or partially covered) with the adhesive layer 80. Accordingly, it is possible to prevent or reduce water from infiltrating into the chip 200-1 from the side surface of the chip 200-1.

Since the solder resist 202-1 is disposed on the bottom of the chip 200-1, it is possible to prevent or reduce water from infiltrating into the chip 200-1 from the bottom. An oxide film may be used instead of the solder resist 202-1, or an oxide film may be further stacked on the solder resist 202-1.

In this way, in various embodiments, in order to obtain a structure in which the grooves 201-1' and 201-2' (and/or the adhesive layers 80-1 and 80-2) remain in the segmented chip 200-1, the width of the groove 201-1 or the groove 201-2 between the chips 200 before being segmented may be preferably set to be larger than the width of a blade which is used for the dicing process.

In this way, by forming the grooves 201 and forming the adhesive layer 80 in the grooves 201, it is possible to improve the moistureproof performance.

Manufacturing of Chip in Second Embodiment

Figure 9:
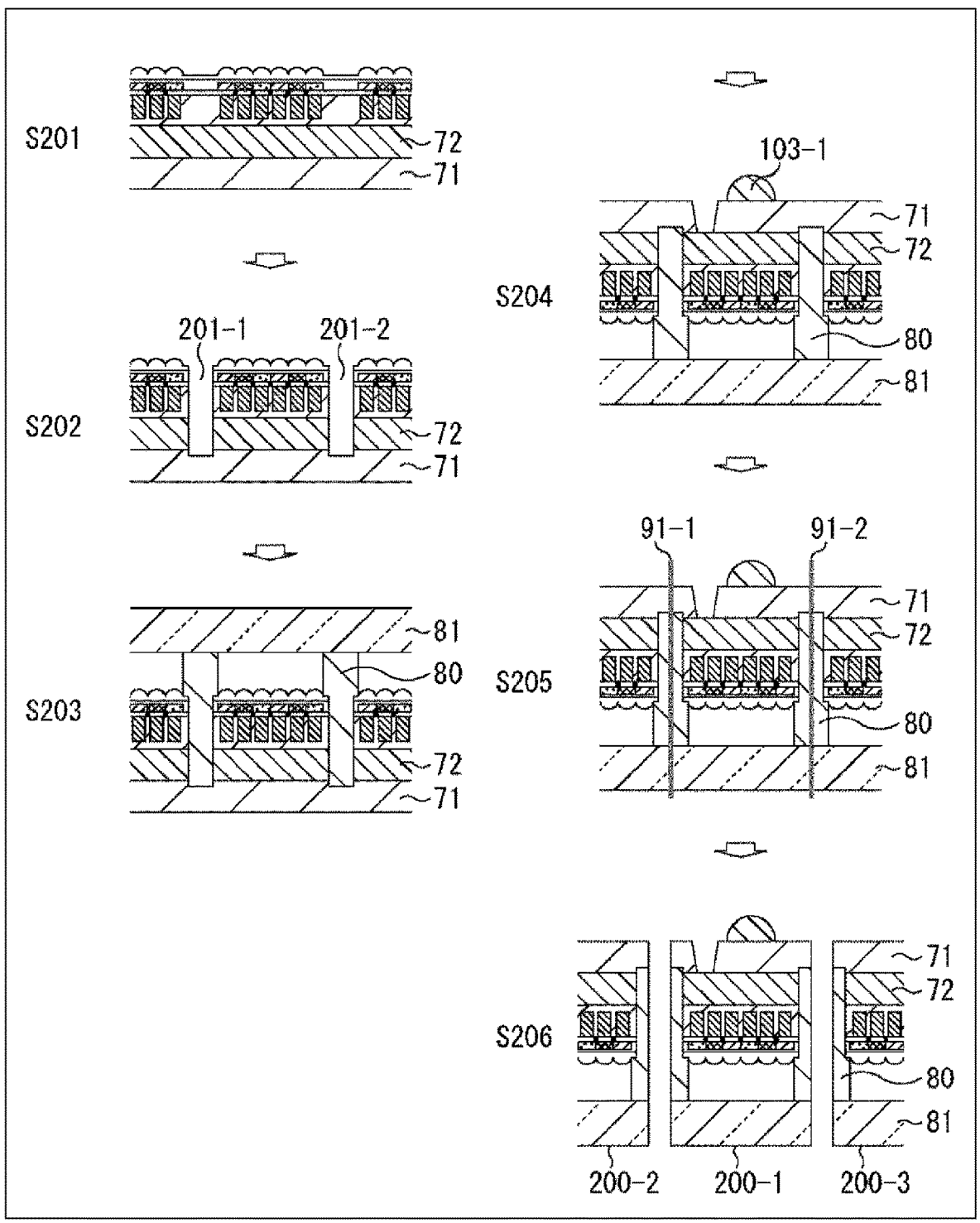
FIG. 9 is an illustrative diagram showing manufacturing of the chip according to the second embodiment.

Illustrative embodiments of manufacturing chips (wafers) having the above-mentioned grooves are described below. FIG. 9 is an illustrative diagram showing processes of manufacturing a chip before being segmented. Regarding the manufacturing process which will be described with reference to FIG. 9, the process of forming a groove which is a feature of the presently disclosed technology will be described below, and processes of manufacturing the other portions, for example, processes of forming layers, can be performed using conventional manufacturing methods and thus description thereof will be appropriately omitted.

Since the same steps as the steps of manufacturing the chip 100 according to the first embodiment are included, description of the same steps will be appropriately omitted.

In step S201, a semiconductor wafer having photodiodes 74 and other elements formed therein is prepared. In step S202, the groove 201-1 and the groove 201-2 are formed in the semiconductor wafer. In step S203, the adhesive layer 80 is formed.

In step S203, the final adhesive layer 80 is formed by forming the adhesive layer 80 on the microlens layer 79 and then removing an unnecessary portion. Thus, the grooves 201 are filled with the same material as the material of the adhesive layer 80 at the same time as forming the adhesive layer 80, but the adhesive layer 80 may be formed in another step.

A part of the formed adhesive layer 80 is removed to form a portion serving as the space layer 211. In this way, when the adhesive layer 80 is formed and then a part thereof is removed, a photosensitive adhesive can be used as the material of the adhesive layer 80. The adhesive layer 80 formed in the portion serving as the space layer 211 is removed by patterning and etching.

The semiconductor wafer is bonded to the cover glass 81 using the adhesive layer 80 further formed in step S203. By bonding the cover glass 81 and the semiconductor wafer in this way, the space layer 211 is formed.

The processes of steps S204 to S206 are the same as steps S104 to S106 of the process of manufacturing the chip 100 illustrated in FIG. 6 and thus description thereof will not be repeated.

In this way, by forming the grooves 201 and forming the adhesive layer 80 in the grooves 201, it is possible to improve the moistureproof performance.

In the second embodiment, as in the first embodiment, the layers up to (and through) the wiring layer 72 are removed in step S202. For example, layers including the wiring layer 72 may be removed, and layer including the wiring layer 72 and a portion of the support substrate 71 may be removed. By first removing the wiring layer 72 from the sensor surface (the photodiode 74 side), it is possible to remove a portion that serves as a start point of cracking by the dicing process (step S206) after the CSP process performed in step S204. Accordingly, it is possible to suppress occurrence of cracking.

When a low-k material (material having a low dielectric constant) is used for the wiring layer 72, damage can be easily caused in the blade dicing and it is possible to perform the removal by laser ablation (LA). When the LA process is performed after step S203 which is a subsequent step, the resin constituting the adhesive layer 80 serving as a protective film may be modified by heat of the LA process. However, by performing the LA process before the resin is applied, it is possible to prevent the modification of the resin caused by the heat.

In this way, by forming the grooves 201, stacking the adhesive layer 80 on the grooves 201, and performing the dicing process at the positions, it is possible to reduce a force applied to interfaces between the films at the time of dicing and to reduce a possibility that problems, such as film peeling or cracking, will occur.

Since the possibility that film peeling or cracking or other problems will occur can be reduced, it is possible to improve the moistureproof performance of the chip.

Third Embodiment

Figure 10:
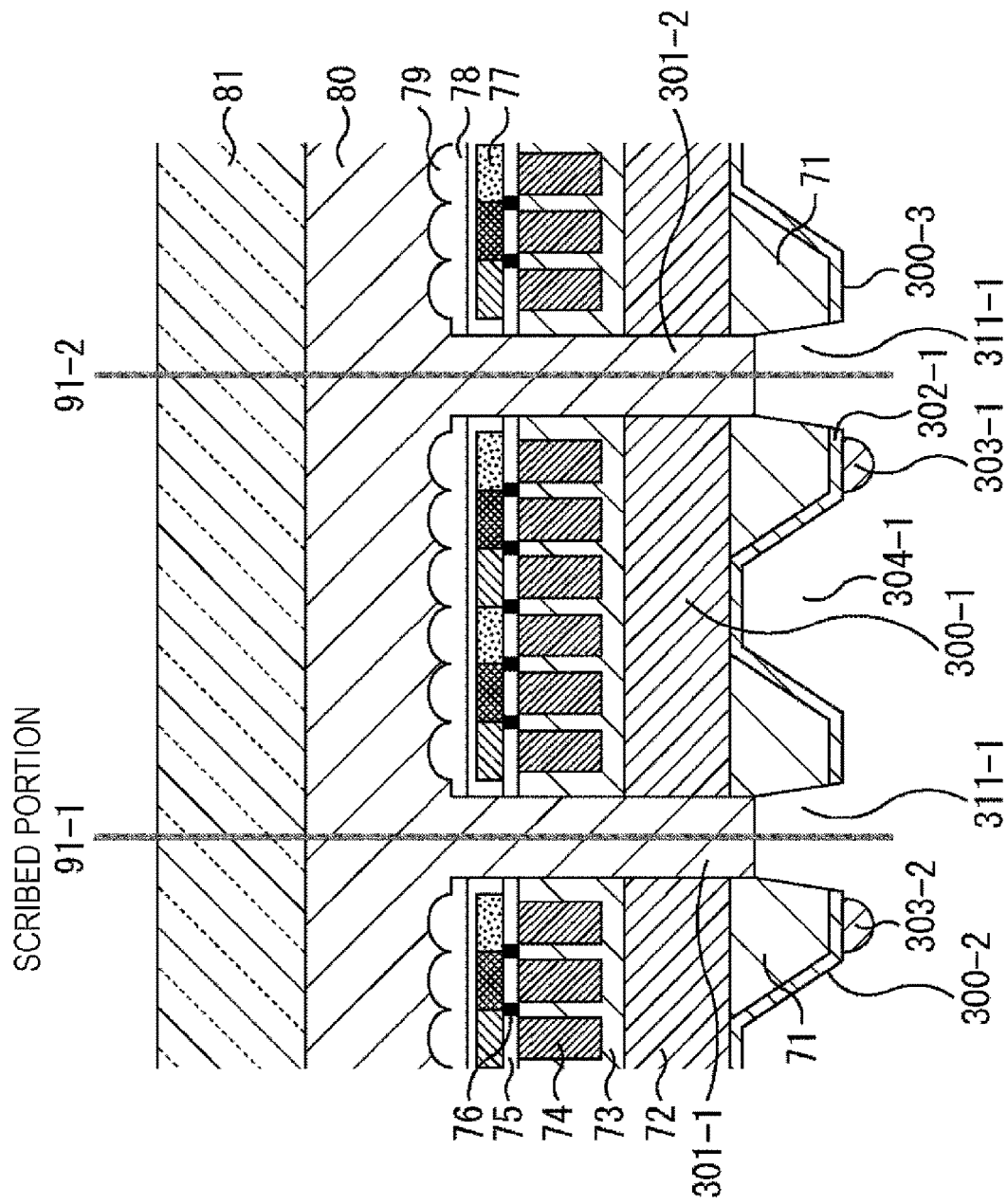
FIG. 10 is an illustrative diagram showing a configuration of a chip according to a third embodiment.

FIG. 10 shows another illustrative configuration of a chip according to a third embodiment. FIG. 10 illustrates a wafer state in which a plurality of chips (e.g., three chips in FIG. 7) are present (e.g., as illustrated in FIG. 4) before being diced.

Here, the chip located at the center is referred to as a chip 300-1, the chip located on the left side is referred to as a chip 300-2, and the chip located on the right side is referred to as a chip 300-3. In the following description, when it is not necessary to individually distinguish the chips 300-1 to 300-3, the chips are simply referred to as the chip 300.

Each chip 300 has the same configuration as the chip 100 described above with reference to FIG. 4 and is a CSP having a cavityless structure, and grooves are formed in the scribed portions 91 to further suppress occurrence of cracking at the time of dicing.

The wafer illustrated in FIG. 10 is provided with a groove 301 between the chips 300. The groove 301-1 is disposed between the chip 300-1 and the chip 300-2 and the groove 301-2 is disposed between the chip 300-1 and the chip 300-3.

A scribed portion 91-1 is disposed between the chip 300-1 and the chip 300-2, and the groove 301-1 is disposed in the scribed portion 91-1. Similarly, a scribed portion 91-2 is disposed between the chip 300-1 and the chip 300-3, and the groove 301-2 is disposed in the scribed portion 91-2.

A groove 311-1 is disposed in the scribed portion 91-1 between the chip 300-1 and the chip 300-2. Similarly, the groove 311-2 is disposed in the scribed portion 91-2 between the chip 300-1 and the chip 300-3.

In the chip 300 illustrated in FIG. 10, like the groove 101 of the chip 100 illustrated in FIG. 1, the groove 301 is disposed to dig into the microlens layer 79, the flattening film 78, the color filter layer 77, the flattening film 75, the silicon substrate 73, the wiring layer 72, and a part of the top portion of the support substrate 71.

A groove 311 is also disposed in the support substrate 71 and the groove 311 is formed to dig into the tip of the adhesive layer 80 filled in the groove 301 from the bottom of the support substrate 71. The groove 301 and the groove 311 are connected in the scribed portion 91.

As will be described later, the grooves 301 are formed, for example, by dicing and the grooves 311 are formed by etching. The grooves 301 and the grooves 311 are formed using appropriate processing methods, respectively.

Figure 11:
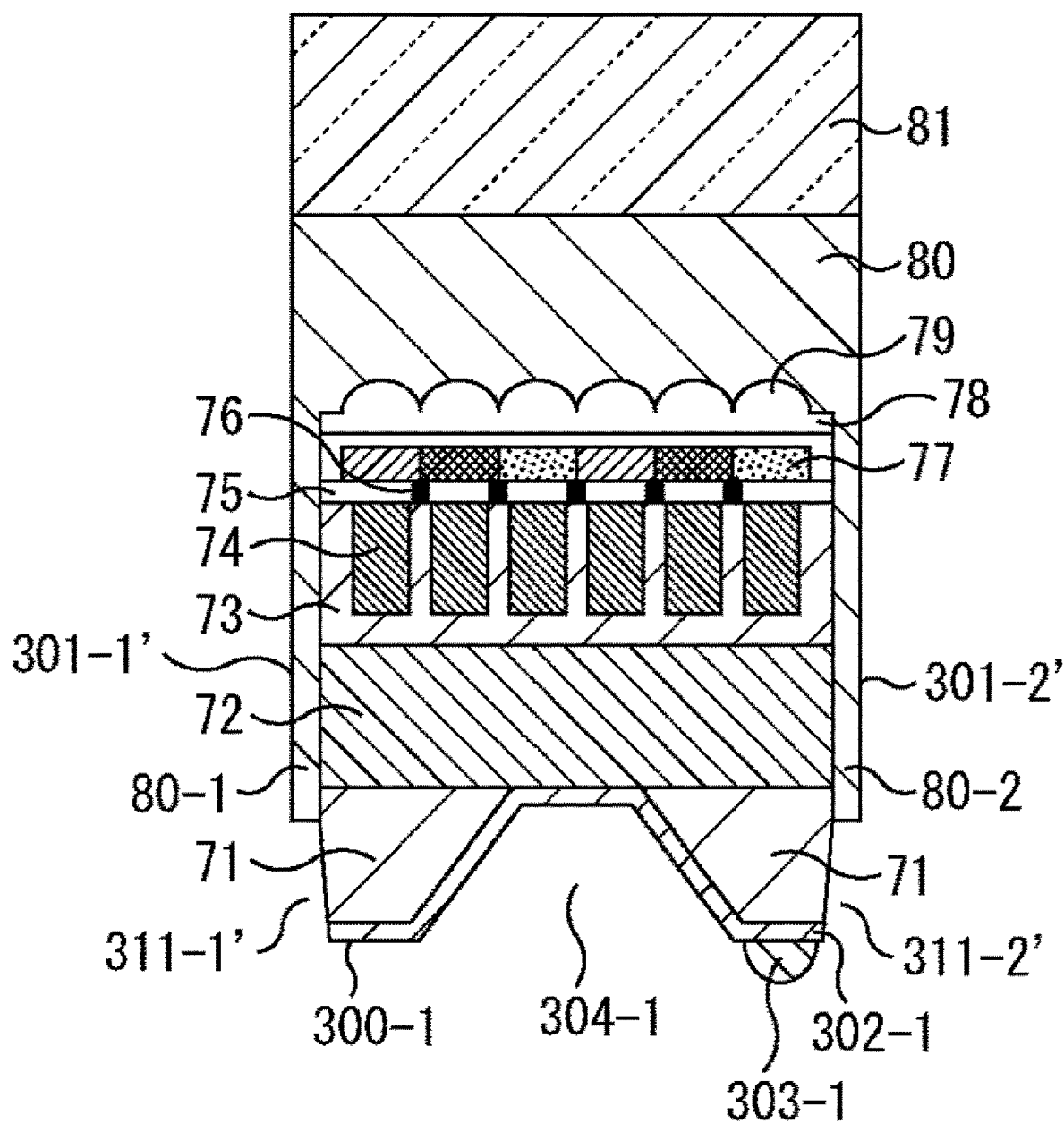
FIG. 11 is an illustrative diagram showing a configuration of the chip according to the third embodiment.

When a wafer in which the grooves 301 and the grooves 311 are disposed between chips 300 is diced at the scribed portions 91, the chip 300-1 illustrated in FIG. 11 is cut out. In the chip 300-1 illustrated in FIG. 11, the microlens layer 79, the flattening film 78, the color filter layer 77, the flattening film 75, the silicon substrate 73, the wiring layer 72, and a part of the support substrate 71 are surrounded by the adhesive layer 80 and are not exposed from the surfaces thereof.

That is, the side surfaces of the microlens layer 79, the flattening film 78, the color filter layer 77, the flattening film 75, the silicon substrate 73, the wiring layer 72, and the support substrate 71 are covered with the same material as the adhesive layer 80.

In this way, the segmented chip 300-1 has a structure in which parts of the stacked layers of the chip 300 are covered at the positions of the groove 301-1' and the groove 301-2' (the grooves after being diced are denoted by adding an apostrophe to the reference numerals thereof to distinguish them from the grooves 301-1 and 301-2 before being diced as illustrated in FIG. 10).

In this way, in order to obtain a structure in which the grooves 301-1' and 301-2' remain in the segmented chip 300-1 and the same material as the adhesive layer 80 remains in those parts, in various embodiments, the width of the groove 301-1 or the groove 301-2 between the chips 300 before being segmented is preferably set to be larger than the width of a blade which is used for the dicing process.

Figure 12:
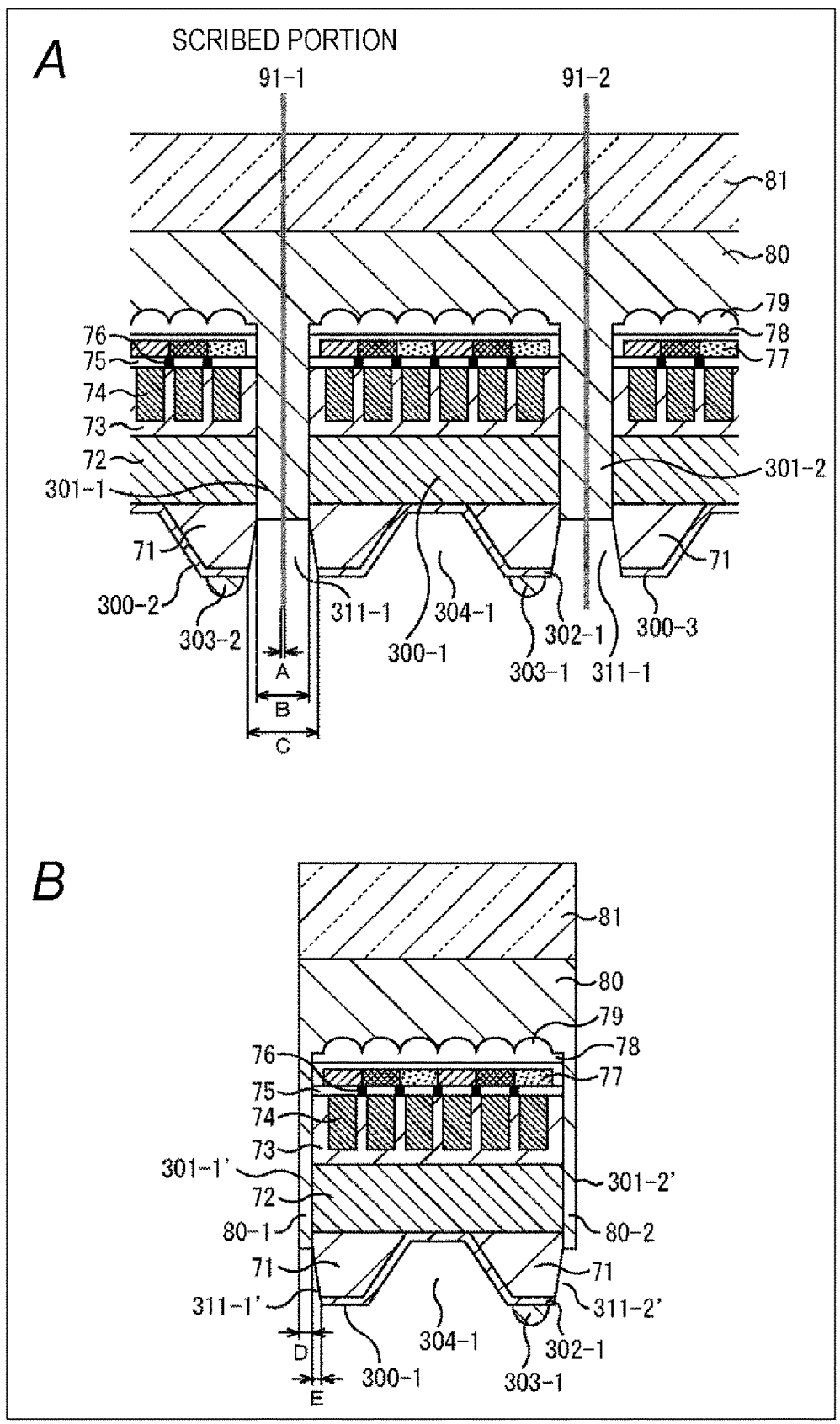
FIG. 12 is an illustrative diagram showing the dimension of a groove of the chip according to the third embodiment.

The chip 300 is provided with the grooves 311, and the width of the grooves 311 is set to be larger than the width of the blade. This configuration will be illustratively described below with reference to FIG. 12.

As illustrated in FIG. 12A, when a scribing width is defined as Z, an etching width of Si (the support substrate 71) is defined as C, a wire-removing width is defined as B, and a resin/glass cutting width is defined as A, a relationship of scribing width Z>etching width C>wire-removing width B>cutting width A is established.

When this relationship is established, as illustrated in FIG. 12B, the thickness D of the adhesive layer 80 formed on the side surface of the segmented chip 300 is set to thickness D=(wire-removing width B−cutting width A)/2.

The etching width C, the wire-removing width B, and the cutting width A need to be smaller by deviations in positional accuracy and width accuracy and a stepped portion needs to be formed, and the structure illustrated in FIG. 12B can be obtained by forming a stepped portion to set the widths satisfying the condition.

For example, regarding dimensions, the scribing width Z=100 μm, the etching width C=80 μm to 95 μm, the wire-removing width B=60 μm to 78 μm, and the cutting width A=40 μm to 50 μm can be set. By setting the widths in this way, it is possible to provide a chip 300 having a resin (the adhesive layer 80) protection structure of D=(60−50)/2=5 μm or more.

The applicant confirmed that improvement in stability of a resin protection structure is obtained by setting the thickness D of the adhesive layer 80 formed on the side surface of the segmented chip 300 to 5 μm or more. From this confirmation, it can be seen that it is possible to manufacture a chip 300 having a stable resin protection structure by setting the etching width C and the like to the above-mentioned numerical values as an example.

In this way, by performing the dicing process in a state in which the grooves 301 and the grooves 311 are formed and the grooves 301 are filled with the same material as the adhesive layer 80, it is possible to reduce a force applied to the interfaces between the films at the time of dicing and to reduce a possibility that film peeling or cracking or other problems will occur. Since the film peeling or the cracking or other problems do not occur or are reduced, it is possible to improve moistureproof performance of the chip.

Since the solder resist 302-1 is disposed on the bottom of the chip 300-1, it is possible to prevent or reduce water from infiltrating into the chip 300-1 from the bottom. An oxide film may be used instead of the solder resist 302-1, or an oxide film may be further stacked on the solder resist 302-1.

Manufacturing of Chip in Third Embodiment

Figure 13:
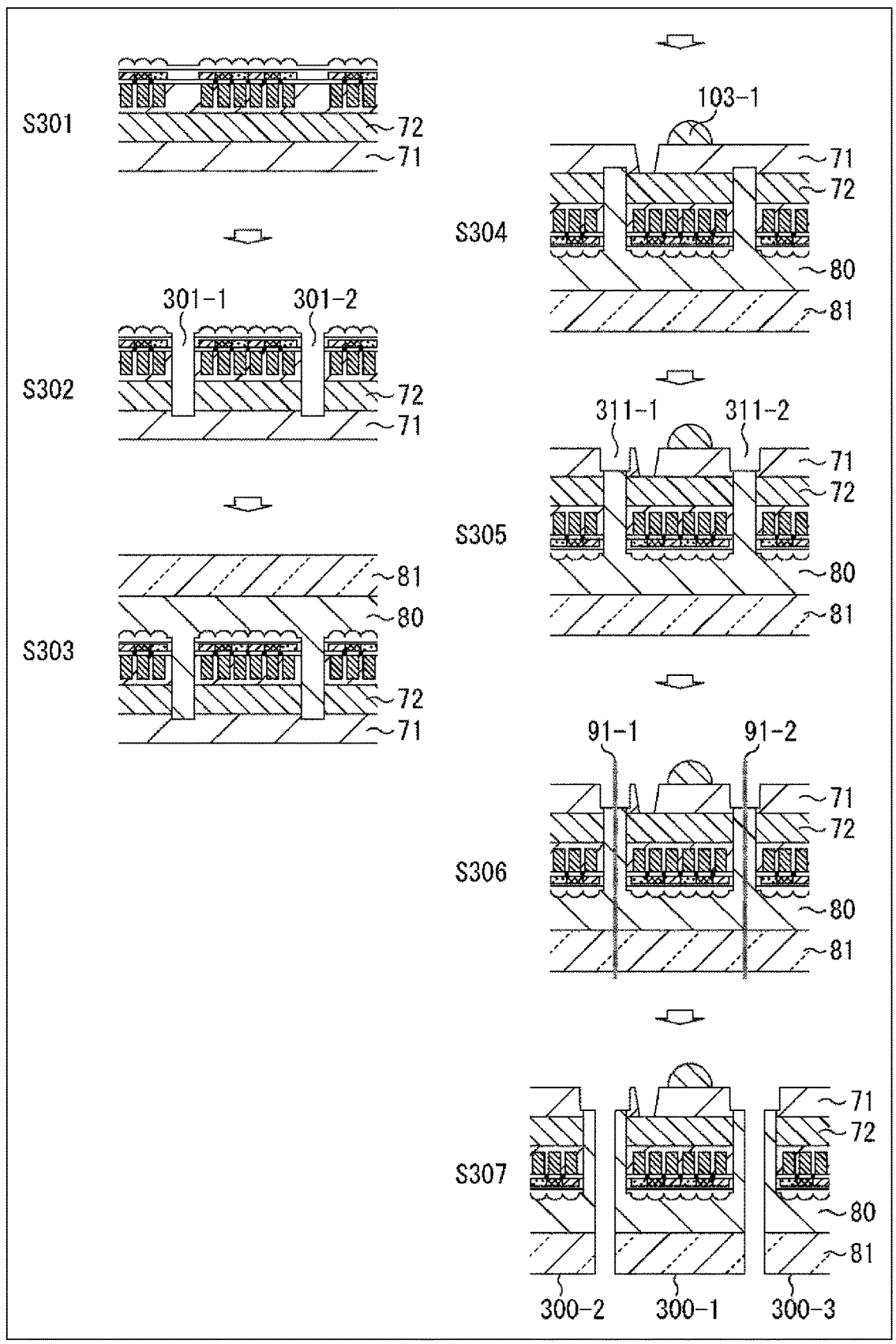
FIG. 13 is an illustrative diagram showing manufacturing of the chip according to the third embodiment.

Illustrative methods of manufacturing chips (wafers) having the above-mentioned grooves will be described. FIG. 13 is an illustrative diagram showing processes of manufacturing a chip before being segmented.

Regarding the manufacturing process which will be described with reference to FIG. 13, the process of forming a groove which is a feature of the presently disclosed technology will be described below, and processes of manufacturing the other portions, for example, processes of forming layers, can be performed using conventional manufacturing methods and thus description thereof will be appropriately omitted.

Since the same steps as the steps of manufacturing the chip 100 according to the first embodiment are included, description of the same steps will be appropriately omitted.

The processes of steps S301 to S304 can be carried out, for example, in the same way as steps S101 to S104 in manufacturing the chip 100 according to the first embodiment illustrated in FIG. 6 and elsewhere herein, and thus description thereof will not be repeated. Through these steps, the grooves 301 are formed and the chips 300 in a state in which the grooves 301 are filled with the same material as the adhesive layer 80 are completed.

In step S305, the grooves 311 are formed. The grooves 311 are formed by etching the support substrate 71 with the etching width C of Si. Since the depth of the grooves 311 are, for example, about 50 μm to 150 μm, the grooves 311 are formed, for example, by dry etching. In the grooves 301 formed by removing the wires in step S302, etching is performed up to the surface of the resin buried in step S303.

In step S306, the semiconductor wafer is segmented into chips by performing the dicing process with the scribing width Z at the scribed portions 91 (step S306).

In this way, by forming the grooves 301 and forming the adhesive layer in the grooves 301, it is possible to improve the moistureproof performance.

In the third embodiment, as in the first embodiment, the layers up to the wiring layer 72 are removed in step S302. By first removing the wiring layer 72 from the sensor surface (the photodiode 74 side), it is possible to remove a portion that serves as a start point of cracking by the dicing process (step S306) after the CSP process performed in step S304. Accordingly, it is possible to suppress occurrence of cracking.

In the third embodiment, since the dicing process is performed after the grooves 311 are formed in the support substrate 71, it is possible to prevent or reduce any occurrence of cracking.

An adhesive (the material of the adhesive layer 80) having a cavityless structure may require optical transparency in addition to heat resistance and moisture resistance for bonding the pixel area. An adhesive satisfying such characteristics is very flexible, and thus the adhesive layer 80 flexibly warps by performing blade dicing. Accordingly, there is a possibility that cracking will occur in the wiring layer 72 which is a relatively harder layer.

However, in this illustrative embodiment, the wiring layer 72 in the scribed portions 91 which is subjected to the dicing process is removed at, for example, a time when the grooves 301 are formed, and it is thus possible to prevent or reduce cracking from occurring in the wiring layer 72 at the time of dicing.

By forming the grooves 311 in the parts of the scribed portions 91 in the support substrate 71, only the adhesive layer 80 (resin) is diced at the time of performing the dicing process as described in step S306. That is, even when the resin is flexible and warps, cracking does not occur or is reduced.

When a low-k material (material having a low dielectric constant) is used for the wiring layer 72 as in the first embodiment, damage can be easily caused in the blade dicing and it may be necessary to perform the removal by laser ablation (LA). When the LA process is performed after step S303, which is a subsequent step, the resin constituting the adhesive layer 80 serving as a protective film may be modified by heat of the LA process. However, by performing the LA process before the resin is applied, it is possible to prevent the modification caused by the heat.

In this way, by forming the grooves 301, stacking the adhesive layer 80 on the grooves 301, and performing the dicing process at the illustrative positions, it is possible to reduce a force applied to interfaces between the films at the time of dicing and to reduce a possibility that film peeling or cracking or other problems will occur.

Since the possibility that problems, such as film peeling or cracking, will occur can be reduced, it is possible to improve the moistureproof performance of the chip.

Fourth Embodiment

Figure 14:
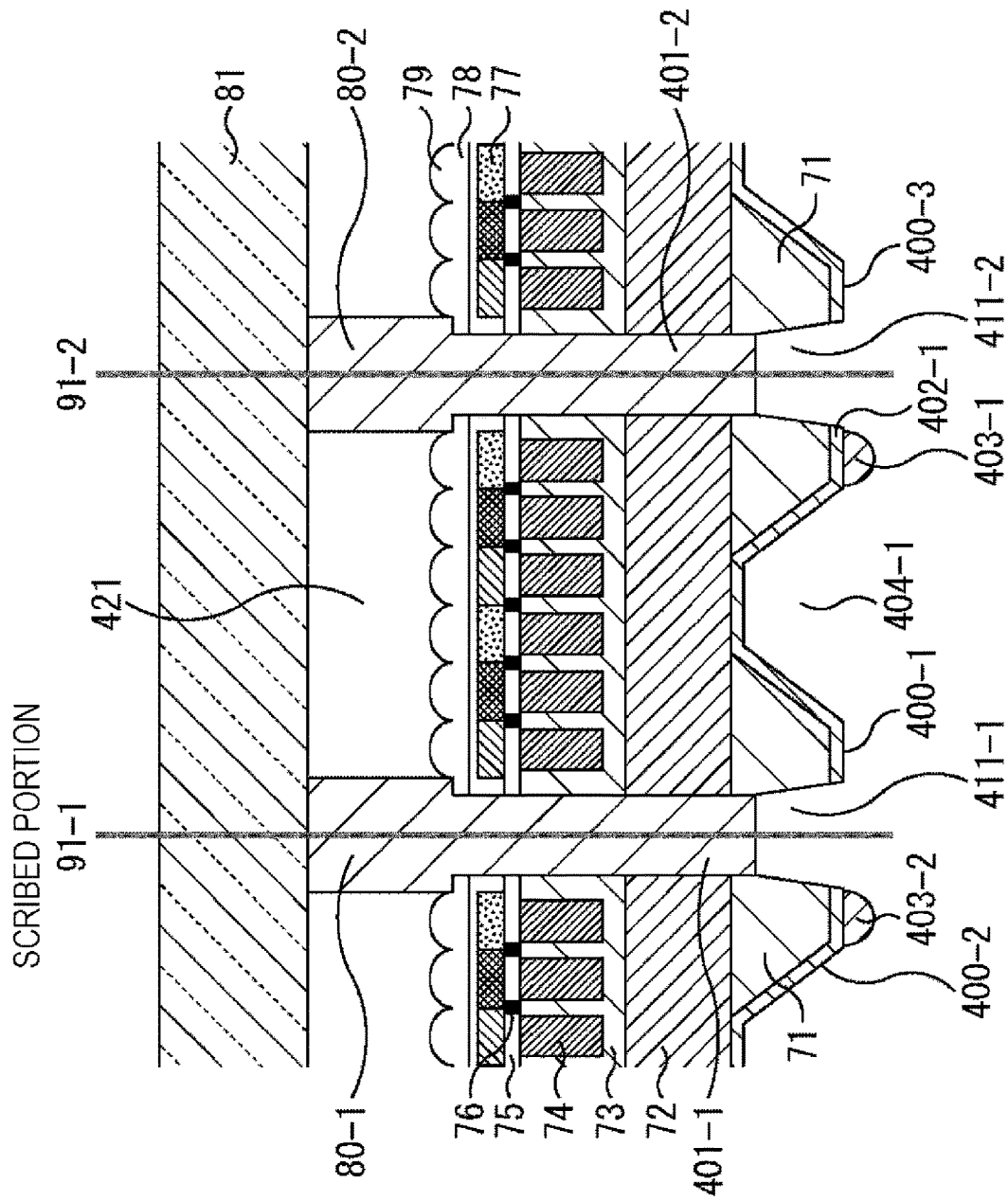
FIG. 14 is an illustrative diagram showing a configuration of a chip according to a fourth embodiment.

FIG. 14 illustrates another configuration of a chip according to a fourth embodiment. FIG. 14 illustrates a wafer state in which a plurality of chips (e.g., three chips as in FIG. 14) are present as illustrated in FIG. 4 before being diced.

Here, the chip located at the center is referred to as a chip 400-1, the chip located on the left side is referred to as a chip 400-2, and the chip located on the right side is referred to as a chip 400-3. In the following description, when it is not necessary to individually distinguish the chips 400-1 to 400-3, the chips are simply referred to as the chip 400.

The chip 400 is a CSP having a cavity structure like the chip 200 according to the second embodiment and is a chip having grooves in the parts of the scribed portions 91 of the support substrate 71 like the chip 300 according to the third embodiment.

In the CSP having a cavity structure, as illustrated in FIG. 14, a space layer 421 is disposed between the microlens layer 79 and the cover glass 81 of the chip 400.

The wafer illustrated in FIG. 14 is provided with a groove 401 between the chips 400. The groove 401-1 is disposed between the chip 400-1 and the chip 400-2 and the groove 401-2 is disposed between the chip 400-1 and the chip 400-3.

The scribed portion 91-1 is disposed between the chip 400-1 and the chip 400-2, and the groove 401-1 is disposed in the scribed portion 91-1. Similarly, the scribed portion 91-2 is disposed between the chip 400-1 and the chip 400-3, and the groove 401-2 is disposed in the scribed portion 91-2.

A groove 411-1 is disposed in the scribed portion 91-1 between the chip 400-1 and the chip 400-2. Similarly, the groove 411-2 is disposed in the scribed portion 91-2 between the chip 400-1 and the chip 400-3.

In the chip 400 illustrated in FIG. 14, the groove 401 is disposed to dig into the microlens layer 79, the flattening film 78, the color filter layer 77, the flattening film 75, the silicon substrate 73, the wiring layer 72, and a shallow part of the support substrate 71.

An adhesive layer 80 formed of the same material as the adhesive layer 80 in the first embodiment is disposed in the grooves 401.

By forming the adhesive layer 80-1 in the groove 401-1, the adhesive layer 80-1 can be formed on the side surfaces of the space layer 421, the microlens layer 79, the flattening film 78, the color filter layer 77, the flattening film 75, the silicon substrate 73, the wiring layer 72, and a part of the support substrate 71.

By forming the adhesive layer 80-2 in the groove 401-2, the adhesive layer 80-2 can be formed on the side surfaces of the space layer 421, the microlens layer 79, the flattening film 78, the color filter layer 77, the flattening film 75, the silicon substrate 73, the wiring layer 72, and a part of the support substrate 71.

A groove 411 is also disposed in the support substrate 71 and the groove 411 is formed to dig into the tip of the adhesive layer 80 filled in the groove 401 from the bottom of the support substrate 71. The groove 401 and the groove 411 are connected in the scribed portion 91.

Figure 15:
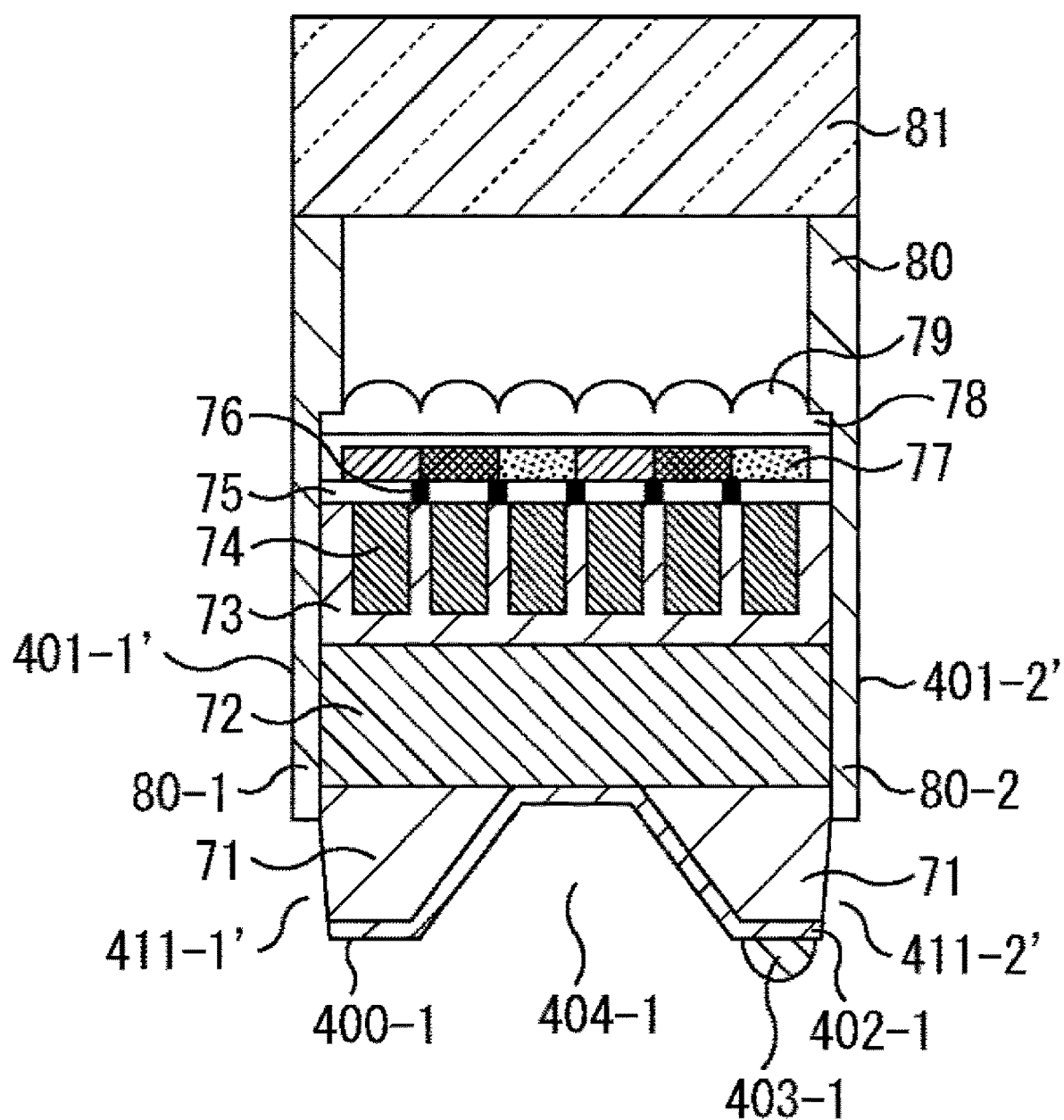
FIG. 15 is an illustrative diagram showing a configuration of the chip according to the fourth embodiment.

When a wafer in which the grooves 401 and the grooves 411 are disposed between chips 400 is diced at the scribed portions 91, the chip 400-1 illustrated in FIG. 15 is cut out. In the chip 400-1 illustrated in FIG. 15, the end surfaces of the space layer 421, the microlens layer 79, the flattening film 78, the color filter layer 77, the flattening film 75, the silicon substrate 73, the wiring layer 72, and a part of the support substrate 71 are covered with the adhesive layer 80 such that the end surfaces are not exposed.

In this way, the segmented chip 400-1 has a structure in which parts of the stacked layers of the chip 400-1 are covered with the adhesive layer 80-1 formed at the positions of the groove 401-1' (the grooves after being diced are denoted by adding an apostrophe to the reference numerals thereof to distinguish them from the groove 401-1 before being diced as illustrated in FIG. 14).

The segmented chip 400-1 has a structure in which parts of the stacked layers of the chip 400-1 are covered with the adhesive layer 80-2 formed at the positions of the groove 401-2'.

In this way, both ends of the chip 400-1 are covered with the adhesive layer 80. Accordingly, it is possible to prevent or reduce water from infiltrating into the chip 400-1 from the side surface of the chip 400-1.

The chip 400 is provided with the grooves 411, and the width of the grooves 411 is set to be larger than the width of the blade. Like the grooves 311 in the third embodiment, when a scribing width is defined as Z (not illustrated), an etching width of Si (the support substrate 71) is defined as C, a wire-removing width is defined as B, and resin/glass cutting width is defined as A, a relationship of scribing width Z>etching width C>wire-removing width B>cutting width A is established.

When this relationship is satisfied, as described above with reference to FIG. 12B, the thickness D of the adhesive layer 80 formed on the side surface of the segmented chip 400 is set to thickness D=(wire-removing width B−cutting width A)/2.

In this way, by performing the dicing process in a state in which the grooves 401 and the grooves 411 are formed and the grooves 401 are filled with the same material as the adhesive layer 80, it is possible to reduce a force applied to the interfaces between the films at the time of dicing and to reduce a possibility that problems, such as film peeling or cracking, will occur. Since the film peeling or the cracking or other problems do not occur or are reduced, it is possible to improve moistureproof performance of the chip.

Since the solder resist 402-1 is disposed on the bottom of the chip 400-1, it is possible to prevent or reduce water from infiltrating into the chip 400-1 from the bottom. An oxide film may be used instead of the solder resist 402-1, or an oxide film may be further stacked on the solder resist 402-1.

Manufacturing of Chip in Fourth Embodiment

Figure 16:
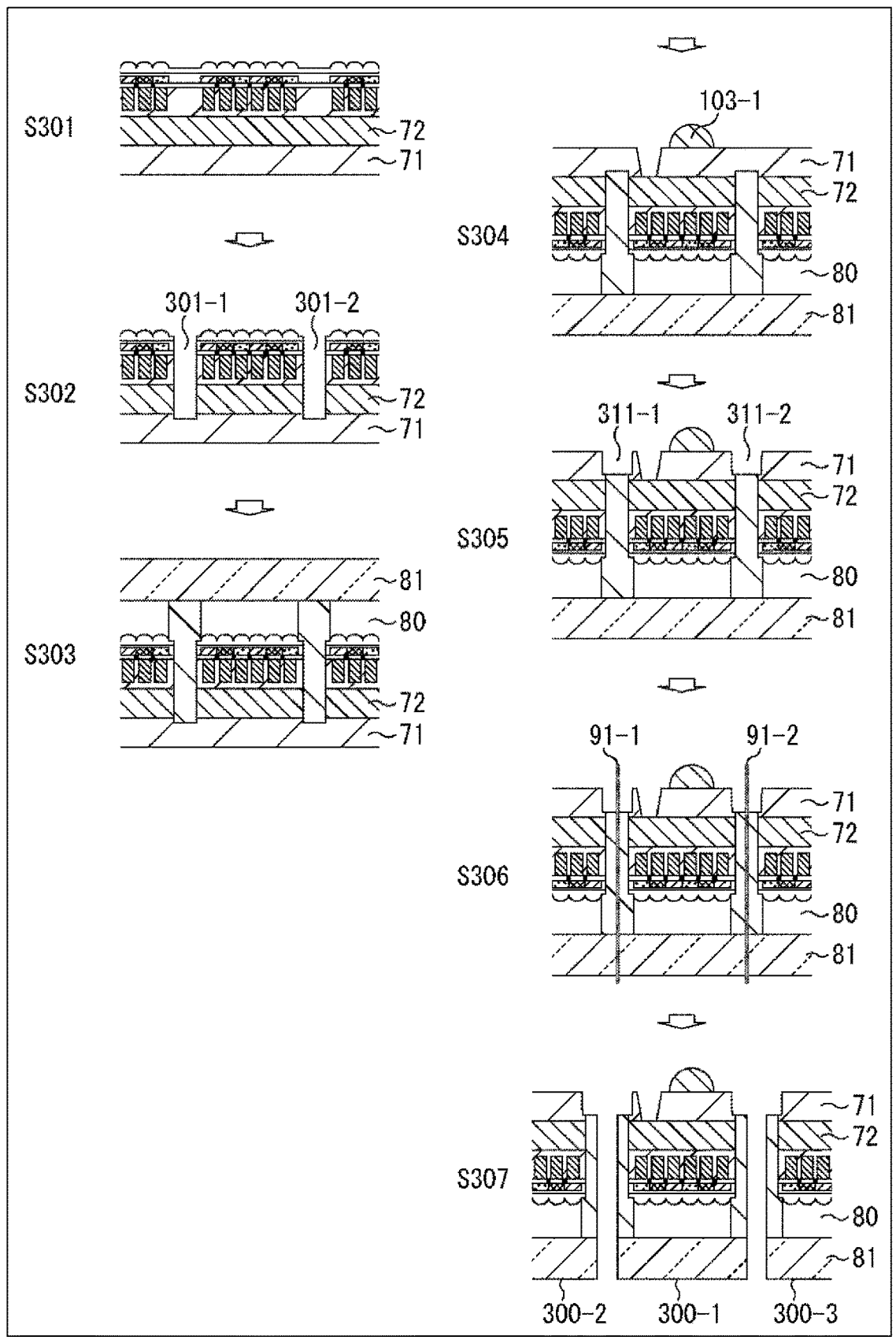
FIG. 16 is an illustrative diagram showing manufacturing of the chip according to the fourth embodiment.

Illustrative methods of manufacturing chips (wafers) having the above-mentioned grooves will be described below. FIG. 16 is an illustrative diagram showing processes of manufacturing a chip before being segmented.

Regarding the manufacturing process which will illustratively be described with reference to FIG. 16, the process of forming a groove which is a feature of the presently disclosed technology will be described below, and processes of manufacturing the other portions, for example, processes of forming layers, can be performed using conventional manufacturing methods and thus description thereof will be appropriately omitted.

Since the same steps as the steps of manufacturing the chip 200 according to the second embodiment are included, description of the same steps will be appropriately omitted.

The processes of steps S401 to S404 can be carried out in the same way as steps S201 to S204 in manufacturing the chip 200 according to the second embodiment illustrated in FIG. 9, for example, and thus description thereof will not be repeated. Through these steps, the grooves 401 are formed and the chips 400 in a state in which the grooves 401 are filled with the same material as the adhesive layer 80 is completed.

In step S405, the grooves 411 are formed. Like the grooves 311 of the chip 300 according to the third embodiment, the grooves 411 are formed by etching the support substrate 71 with the etching width C of Si. Since the depth of the grooves 411 are, for example, about 50 μm to 150 μm, the grooves 411 are formed, for example, by dry etching. In the grooves 401 formed by removing the wires in step S402, etching is performed up to the surface of the resin buried in step S404.

In step S406, the semiconductor wafer is segmented into chips by performing the dicing process at the scribed portions 91 (step S406).

In this way, by forming the grooves 401 and forming the adhesive layer in the grooves 401, it is possible to improve the moistureproof performance.

In the fourth embodiment, as in the first embodiment, the layers up to (and through) the wiring layer 72 are removed in step S402. For example, layers including the wiring layer 72 may be removed, and layer including the wiring layer 72 and a portion of the support substrate 71 may be removed. By first removing the wiring layer 72 from the sensor surface (the photodiode 74 side), it is possible to remove a portion that serves as a start point of cracking by the dicing process (step S406) after the CSP process performed in step S404. Accordingly, it is possible to suppress occurrence of cracking.

In the fourth embodiment, since the dicing process is performed after the grooves 411 are formed in the support substrate 71, it is possible to prevent or reduce any occurrence of cracking.

When a low-k material (material having a low dielectric constant) is used for the wiring layer 72 as in the first embodiment, damage can be easily caused in the blade dicing and it is possible to perform the removal by laser ablation (LA). When the LA process is performed after step S404 which is a subsequent step, the resin constituting the adhesive layer 80 serving as a protective film may be modified by heat of the LA process. However, by performing the LA process before the resin is applied, it is possible to prevent the modification caused by the heat.

In this way, by forming the grooves 401, stacking the adhesive layer 80 on the grooves 401, and performing the dicing process at the positions, it is possible to reduce a force applied to interfaces between the films at the time of dicing and to reduce a possibility that film peeling or cracking or other problems will occur.

Since the possibility that film peeling or cracking or other problems will occur can be reduced, it is possible to improve the moistureproof performance of the chip.

As described above, according to illustrative embodiments of the presently disclosed technology, in order to remove damage in the wiring layer, the wiring layer is removed by laser ablation (LA), half cutting using a blade, or a similar method or device and Si is removed by etching, to obtain a structure in which cracking or other damage does not occur (or is reduced) in the Si/wiring layer.

By setting the removing width of the wiring layer, the Si etching width, and the cutting width of the resin and the glass to appropriately dimensions, it is possible to achieve a resin protection structure in which a resin (adhesive) for glass bonding is appropriately left in the part of the wiring layer on the side surface of a package (chip). Accordingly, it is possible to reduce mechanical contact damage or influence of a high temperature and high humidity on the sensor unit and thus to obtain a structure with higher reliability.

By performing the process of removing the wiring layer before the glass bonding, it is possible to preliminarily remove a part serving as a start point of cracking. When a low-k layer is used for the wiring layer, damage can be easily caused in the blade dicing and it may thus be necessary to remove the damage by laser ablation (LA). However, according to embodiments of the presently disclosed technology, it is possible to prevent the resin serving as a protection film from being modified by the heat of the LA and thus to more stabilize the function of the resin protection film.

<Segmentation Using Optical Laser>

In the first to fourth embodiments, the segmentation is performed using a dicing blade, but the segmentation may be performed in other ways without using the dicing blade.

Here, an illustrative example in which the segmentation is performed using an optical laser will be described. Since this example can be applied to any of the chip 100, the chip 200, the chip 300, and the chip 400 according to the first to fourth embodiments, the chip 100 will be exemplified herein.

Figure 17:
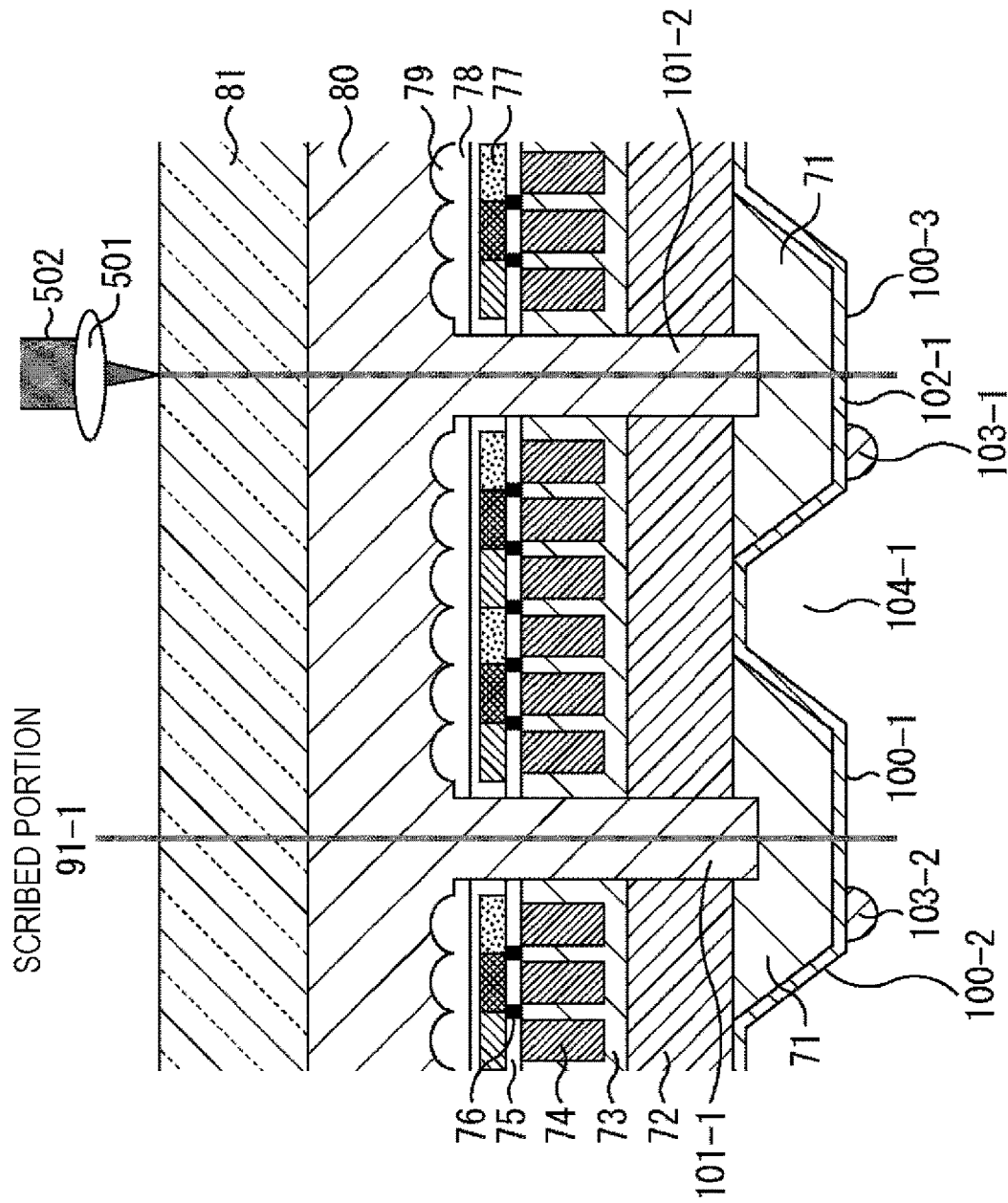
FIG. 17 is an illustrative diagram showing segmentation using a laser.

The segmentation using an optical laser will be illustratively described below with reference to FIG. 17. FIG. 17 illustrates a state of the chip 100 (e.g., illustrated in FIG. 4) before being segmented. The segmentation step corresponds to step S105 (e.g., FIG. 6). The segmentation step corresponds to step S205 (e.g., FIG. 9) when the chip 200 is processed, corresponds to step S306 (e.g., FIG. 13) when the chip 300 is processed, and corresponds to step S406 (e.g., FIG. 16) when the chip 400 is processed.

When the chip 100-1 and the chip 100-3 are cut at the scribed portion 91-2 to segment the wafer, the optical laser 502 is focused by a focusing lens 501 and is applied to the scribed portion 91-2.

The optical laser 502 is applied to the cover glass 81, the cover glass 81 is removed, and the adhesive layer 80 is removed after the cover glass 81 is removed. Accordingly, the segmentation is performed by removing the cover glass 81 and the adhesive layer 80.

For example, the optical laser 502 with 10 ps and peak power of 100 µJ using a YAG laser beam of 1060 nm is used and applied to the cover glass 81. The NA of the focusing lens 501 is set to, for example, about 0.8. The optical laser 502 is focused on the surface of the cover glass 81, causes a refractive index difference in the glass of the beam center and the laser beam does not diffuse but travel straightly in a thin state.

Figure 18:
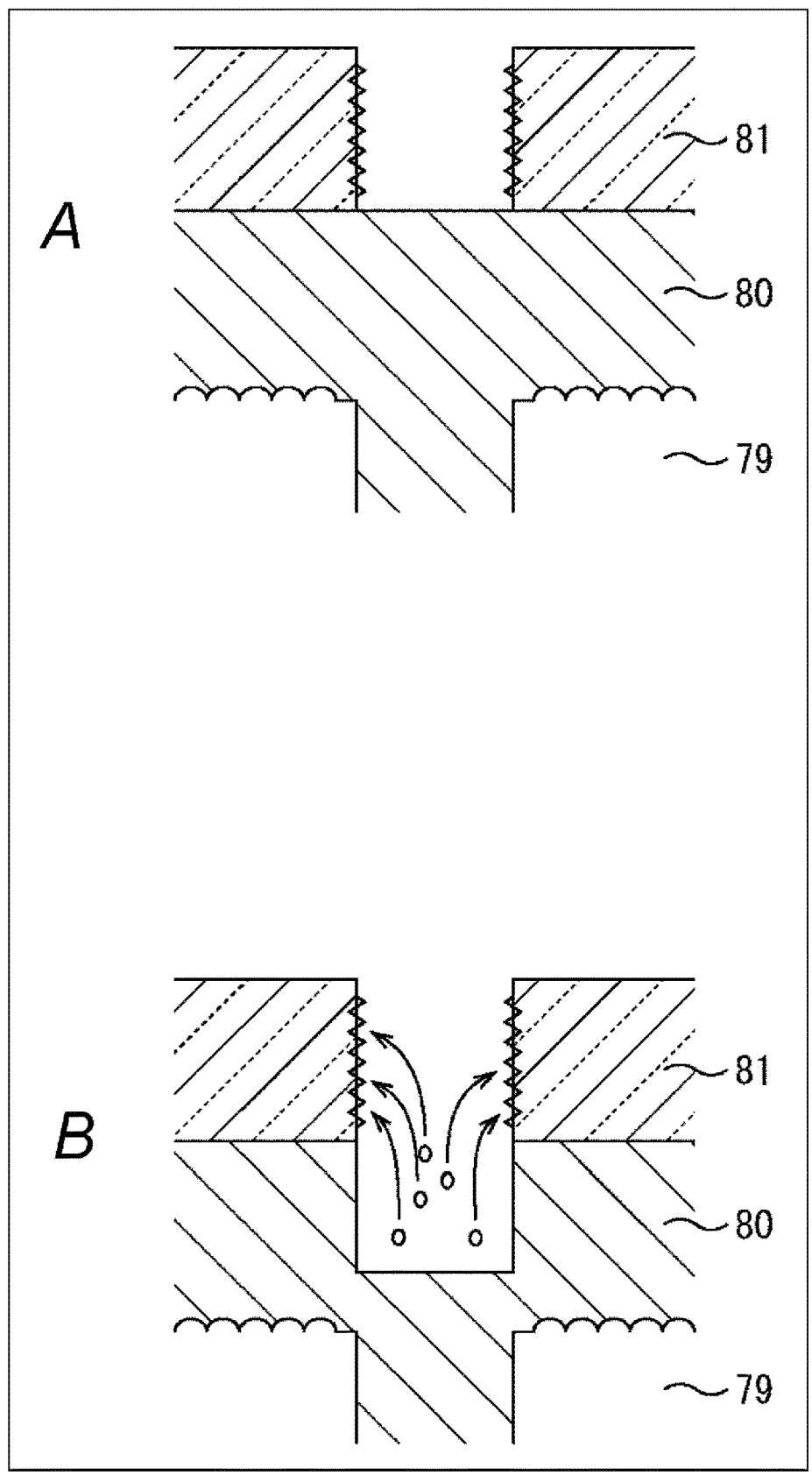
FIG. 18 is an illustrative diagram showing attachment of debris.

As illustratively shown in FIG. 18A, the cover glass 81 closer to the surface is ablated, and a hole is slowly formed and deepened. When the processing progresses, the layer of the cover glass 81 is all removed and the underlying resin (the adhesive layer 80) is exposed (FIG. 18A). Subsequently, when the resin is also ablated by the optical laser 502, the material of the adhesive layer 80 is sublimated and attached to the side wall of the cover glass 81 as illustratively shown in FIG. 18B.

The side wall of the cover glass 81 is damaged by the ablation and is exposed as a damaged layer as illustrated in FIG. 18A. When the side wall of the cover glass 81 is damaged, there is a possibility that the cover glass 81 will be missed, causing dust, for example, when mounting due to mechanical contact damage or the like.

However, by sublimating the adhesive layer 80 by the optical laser 502 and attaching the adhesive layer 80 (resin) to the damaged layer (side wall) of the cover glass 81, it is possible to form a coating film on the damaged layer. By coating the damaged layer, it is possible to reduce the possibility that the cover glass 81 will be missed to cause dust.

That is, in this case, when the adhesive layer 80 is being processed by the optical laser 502, a part of the adhesive layer 80 is attached to the side wall of the cover glass 81 and a coating film is formed on the side wall of the cover glass 81. This coating film is a coating film having such adhesiveness such that it is not easily removed. By covering the damaged layer of the glass end surface with the coating film to reduce roughness, it is possible to disperse an external force to prevent or reduce generation of dust.

Figure 19:
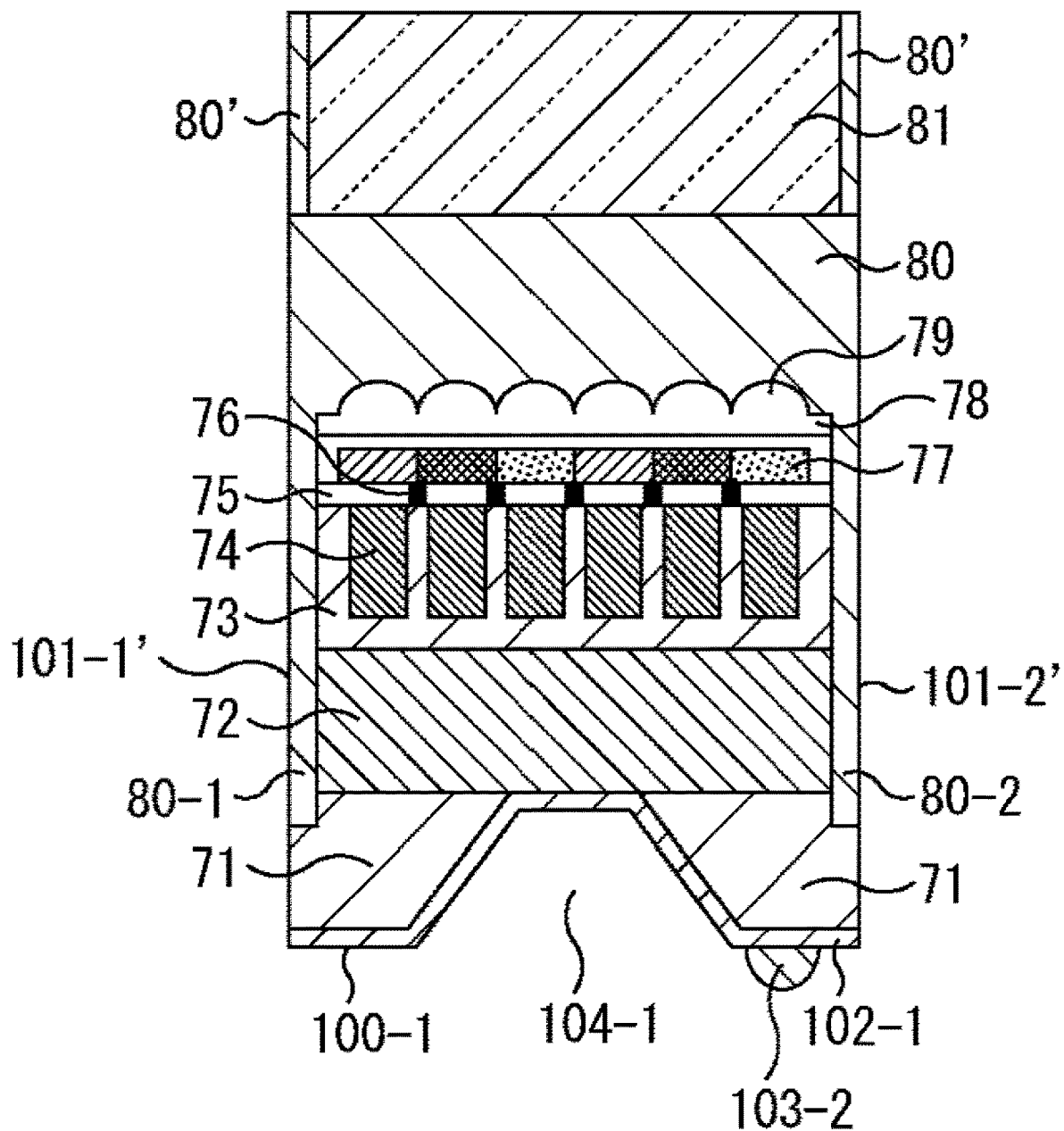
FIG. 19 is an illustrative diagram showing a configuration of a chip which is segmented by a laser.

FIG. 19 illustratively shows a chip 100 (chip 100-1) segmented by the optical laser 502. The coating layer of debris (e.g., deposited material) 80' is formed on the side wall of the cover glass 81. In this case, the debris 80' is the same material as the adhesive layer 80 and is formed by sublimating and attaching the adhesive layer 80 to the cover glass 81 at, for example, the time of processing, as described above.

In this way, in order to facilitate attachment of the debris 80' to the side wall of the cover glass 81, a difference may be made between the irradiation condition of the optical laser 502 in processing the cover glass 81 and the irradiation condition of the optical laser 502 in processing the adhesive layer 80 (e.g., resin). In other words, the irradiation condition of the optical laser 502 in processing the adhesive layer 80 (e.g., resin) may be set to a condition in which the debris 80' is actively generated and attached to the side wall of the cover glass 81.

In this way, the processing may be started from the surface of the cover glass 81 using the optical laser 502. When this process is performed, the scribed portions 91 of the chips 100, 200, 300, and 400 are filled with a resin and thus it is possible to suppress or prevent occurrence of cracking at the time of processing.

In the chips 300 and 400, since the grooves 311 and 411 are formed before the processing using the optical laser 502 is performed, it is possible to further suppress occurrence of cracking in processing.

<Segmentation Using Stealth Dicing>

In the first to fourth embodiments, the segmentation is performed using a dicing blade, but the segmentation may be performed in another way without using the dicing blade.

Here, an illustrative example in which the segmentation is performed using stealth dicing will be described. The stealth dicing is, for example, a technique of performing a dicing process by focusing a laser beam of a transmissive wavelength on the inside of the semiconductor wafer using an objective-lens optical system and scanning the semiconductor wafer along a cutting line.

For example, in the third embodiment, the grooves 311 are formed in the chip 300 before the dicing to prevent or reduce occurrence of cracking, but the stealth dicing can be applied to formation of the grooves 311. For example, the segmentation process in the chip 300 is described above with reference to FIG. 13, and the grooves 311 are formed in step S305. In step S305, the grooves 311 can be formed in the support substrate 71 using the stealth dicing.

Similarly, for example, in the fourth embodiment, the grooves 411 are formed in the chip 400 before the dicing to prevent or reduce occurrence of cracking, but the stealth dicing can be applied to formation of the grooves 411. For example, the segmentation process in the chip 400 is described above with reference to FIG. 16, and the grooves 411 are formed in step S405. In step S405, the grooves 411 can be formed in the support substrate 71 using the stealth dicing.

Figure 20:
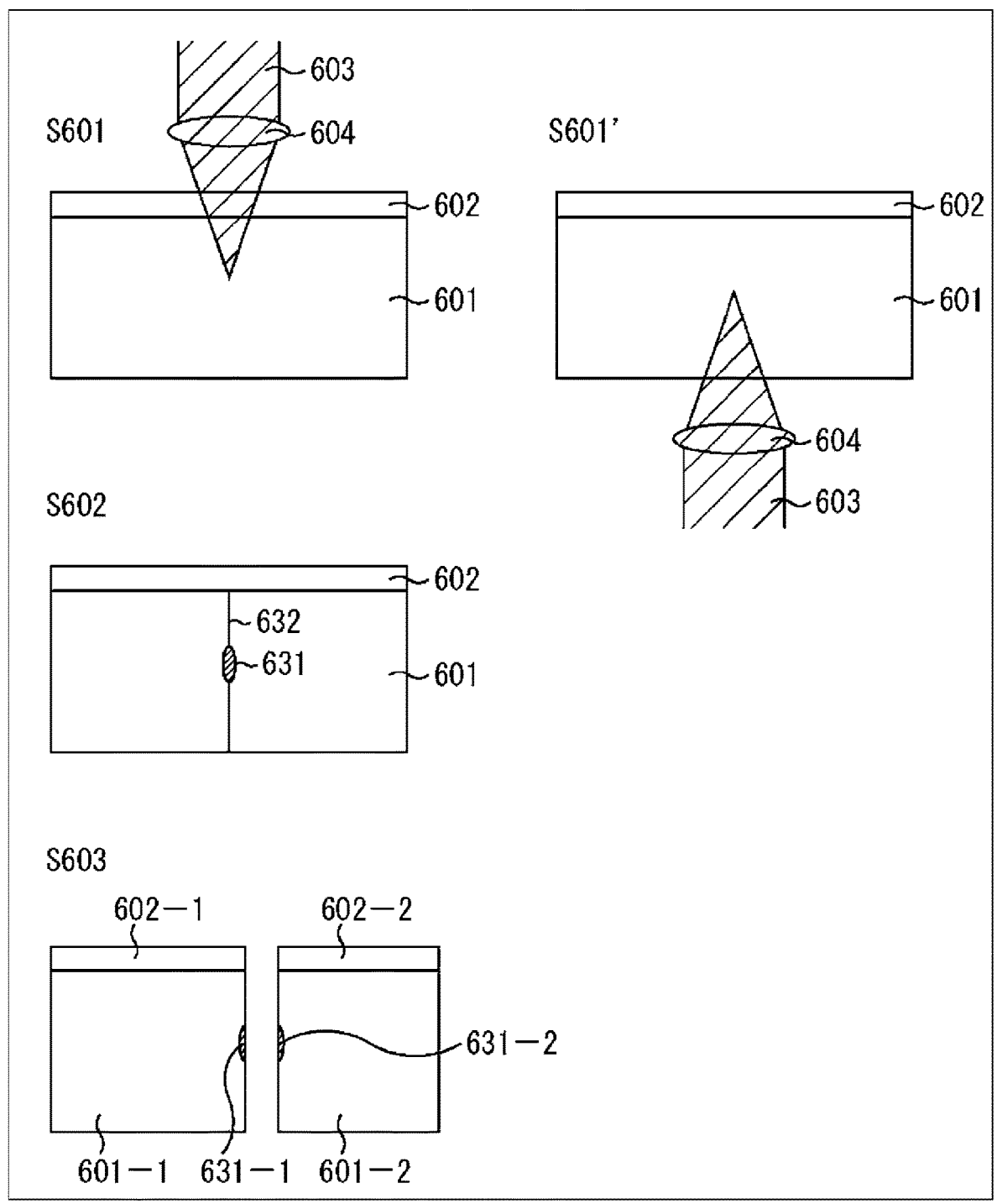
FIG. 20 is an illustrative diagram showing stealth dicing.

An illustrative example in which the stealth dicing is used to segment the chip 300 or the chip 400 will be described later, and the stealth dicing will be first described in brief with reference to FIG. 20. Referring to FIG. 20, in step S601, when a board in which a circuit board 602 having logic circuits or photodiodes or similar elements formed therein are stacked on a Si substrate 601 is segmented using the stealth dicing, a laser beam 603 of a transmissive wavelength is focused on the inside of the Si substrate 601 with an objective lens 604.

By using the optimized laser beam 603 and the objective lens 604, it is possible to perform local and selective laser processing on only the inside of the Si substrate 601 without damaging the surface or the rear surface of the Si substrate 601. In the Si substrate 601 subjected to the laser processing, a modified layer 631 is formed therein as illustrated in step S602 of FIG. 20, and a vertical crack 632 is formed from the modified layer 631 as a start point to the surface and the rear surface of the Si substrate 601.

In step S601 of FIG. 20, the laser processing is performed from the circuit board 602 side, but the laser processing may be performed from the Si substrate 601 side as illustrated in step S601' of FIG. 20. That is, the modified layer 631 may be formed by performing the irradiation with a laser beam from the circuit board 602 side (the upper side in the drawing) or the modified layer 631 may be formed by performing the irradiation with a laser beam from the Si substrate 601 side (the lower side in the drawing). Even when the irradiation with a laser beam is performed from any side, the modified layer 631 can be formed in the Si substrate 601 as illustrated in step S602.

Although not illustrated in FIG. 20, for example, a DC tape can be attached to the bottom of the Si substrate 601 and the DC tape can be detached by stretching the DC tape after the laser processing is performed. That is, when the DC tape is stretched in the state illustrated in step S602 of FIG. 20, the Si substrate is divided into two substrates of a Si substrate 601-1 and a Si substrate 601-2 as illustrated in step S603.

When the substrate is segmented using the stealth dicing, the modified layer 631-1 or the modified layer 631-2 remains on the processing end surfaces after being segmented, and there is a possibility that detached particles will be formed due to touch, impact, or other actions applied to the modified layer 631. For example, when an imaging device is formed in the circuit board 602, there is a possibility that imaging failure will occur due to detached particles. Accordingly, when the segmentation is performed using the stealth dicing, it is advantageous to prevent or reduce detached particles from being formed from the modified layer 631 to prevent or reduce occurrence of a problematic influence.

Figure 21:
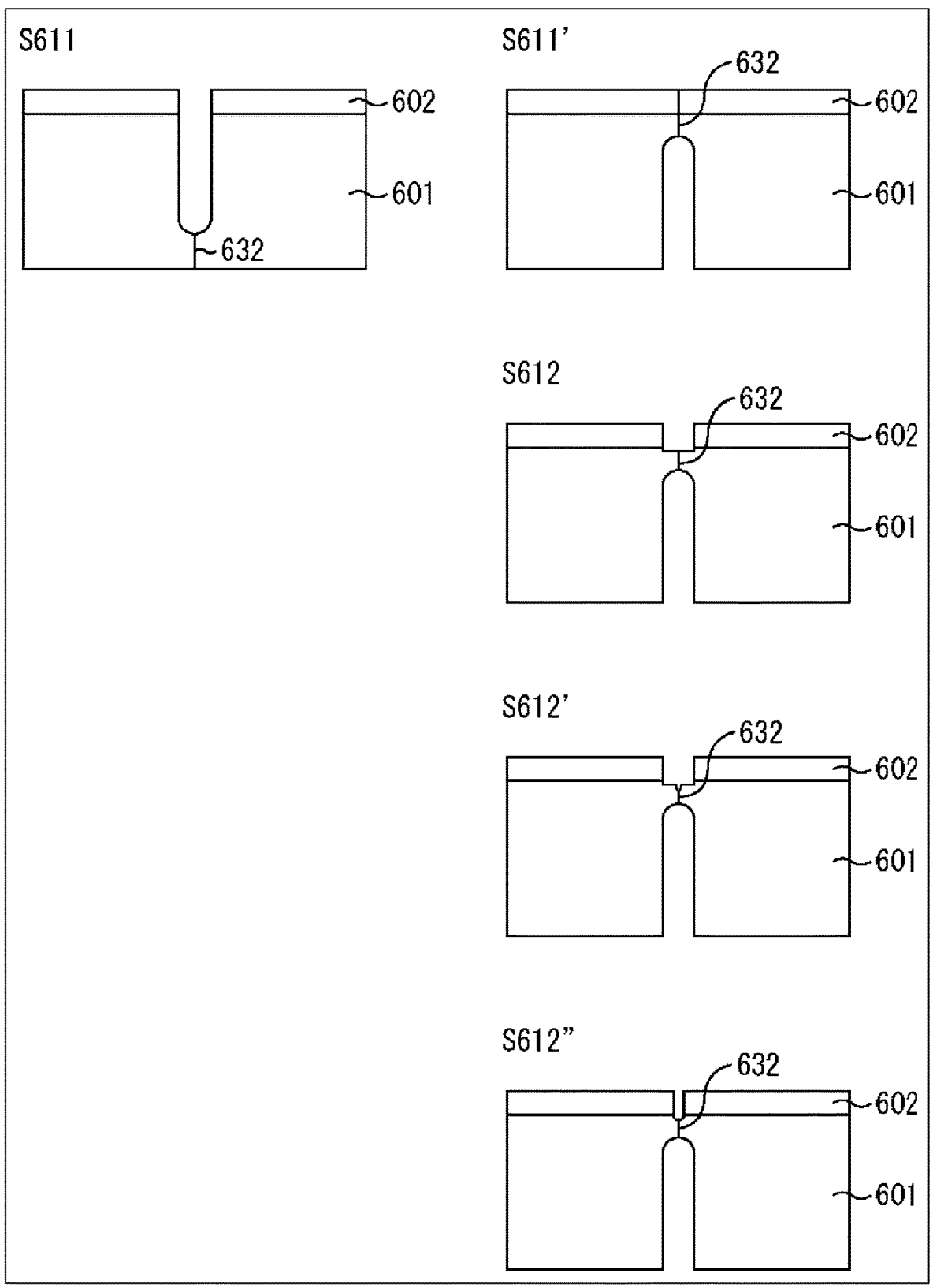
FIG. 21 is an illustrative diagram showing removal of a modified layer.

Accordingly, as illustratively shown in FIG. 21, the modified layer 631 is removed by the blade dicing. After the modified layer 631 and the crack 632 are formed inside the Si substrate 601 through steps S601 and S602 illustrated in FIG. 20, half cutting is performed up to a position deeper than the bottom surface of the modified layer 631 using the blade dicing in step S611 (FIG. 21). In step S611, the modified layer 631 is removed. In other words, the blade dicing is performed up to the depth at which the modified layer 631 is removed.

By performing the process of step S603 (e.g., FIG. 20) after the modified layer 631 is removed, the segmentation is performed. When the modified layer 631 is removed, a stress is applied to the crack 632 located below the modified layer 631 and the crack 632 progresses. At this time, the dividing of the Si substrate 601 is established. After the modified layer 631 is removed, the Si substrate may be divided by stretching.

By removing the modified layer 631 in this way, it is possible to prevent or reduce detached particles from being formed from the modified layer 631 and to prevent or reduce a problematic influence.

In step S611 of FIG. 21, the blade dicing is performed from the circuit board 602 side, but the blade dicing may be performed from the Si substrate 601 side as illustrated in step S611' of FIG. 21. That is, the modified layer 631 may be removed by performing the blade dicing from the circuit board 602 side (the upper side in the drawing) or the modified layer 631 may be formed by performing the blade dicing from the Si substrate 601 side (the lower side in the drawing). Even when the blade dicing is performed from any side, the segmentation can be performed as illustrated in step S603.

When the blade dicing is performed from the Si substrate 601 side, a groove may be formed in a part which is cut to segment the circuit board 602, for example, by laser ablation or half-cut dicing or a combination thereof as illustrated in step S612 of FIG. 21, before or after the blade dicing is performed.

As illustrated in steps S612' and S612" of FIG. 21, a V-shaped groove may be further formed in the groove formed in the circuit board 602. It is possible to stabilize a shape by forming the V-shaped groove in the bottom (Si substrate 601) of the groove of the circuit board 602. That is, it is possible to perform segmentation such that the shape of the side surface of the Si substrate 601 after being segmented is as flat as possible without being roughened.

As illustrated in step S612', the V-shaped groove may be formed on the Si substrate 601 side so as to be smaller than the groove formed in the circuit board 602. As illustrated in step S612", the V-shaped groove may be formed on the Si substrate 601 side so as to have the same size as the groove formed in the circuit board 602.

The V-shaped groove formed in the Si substrate 601 may be formed at the time of forming the groove of the circuit board 602 or may be formed at a timing other than the time of (in a step other than the step of) forming the groove of the circuit board 602.

For example, the V-shaped groove formed on the Si substrate 601 side can be formed by a laser ablation process, a liquid-crystal anisotropic wet etching process, a dry etching process, or the like.

As described above, the stealth dicing can be used to segment the chip 300 or the chip 400, for example. When the stealth dicing is used to segment the chip 300 or the chip 400, the stealth dicing can be applied to formation of the grooves 311 or 411 in the support substrate 71. Therefore, this case is described below.

Figure 22:
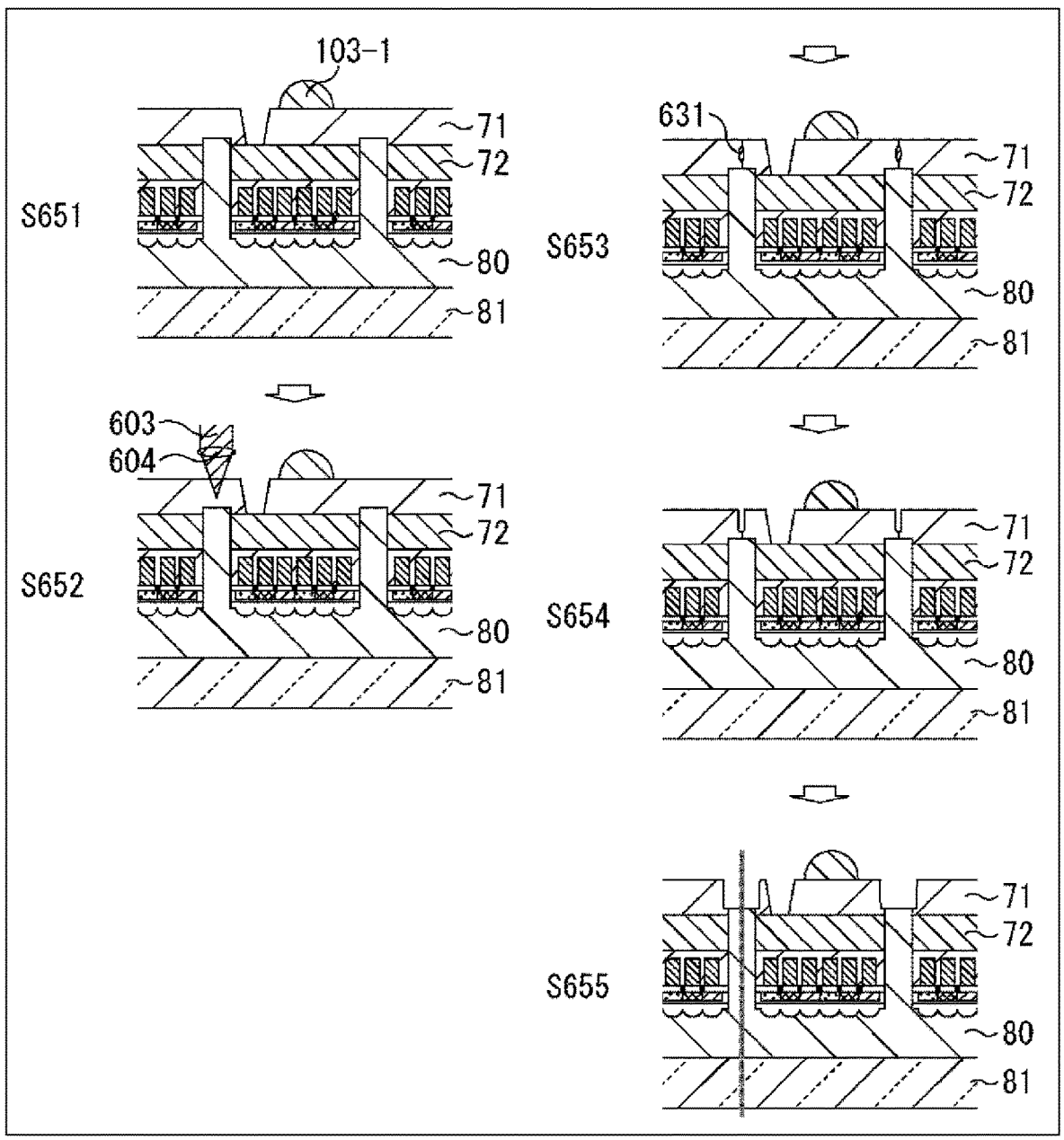
FIG. 22 is an illustrative diagram showing segmentation using stealth dicing.

An illustrative example in which the stealth dicing is used to segment the chip 300 will be described below with reference to FIG. 22. In step S651, the CSP process is performed. Although not illustrated in the drawing, the grooves 301 are formed and are filled with a resin, for example, by performing the same processes as steps S301 to S303 illustrated in FIG. 13, and then the process of step S651 is performed.

In step S652, the support substrate 71 is irradiated with a laser beam 603 to perform the stealth dicing. A modified layer 631 and a crack 632 are formed as illustrated in step S643 by irradiation with the laser beam 603. In step S654, the half cutting is performed up to a position deeper than the bottom of the modified layer 631 by the blade dicing. In this way, the grooves 311 are formed in the support substrate 71.

In step S655, the substrate is segmented by performing the dicing. The segmented chip 300 is illustratively shown in FIG. 23.

Figure 23:
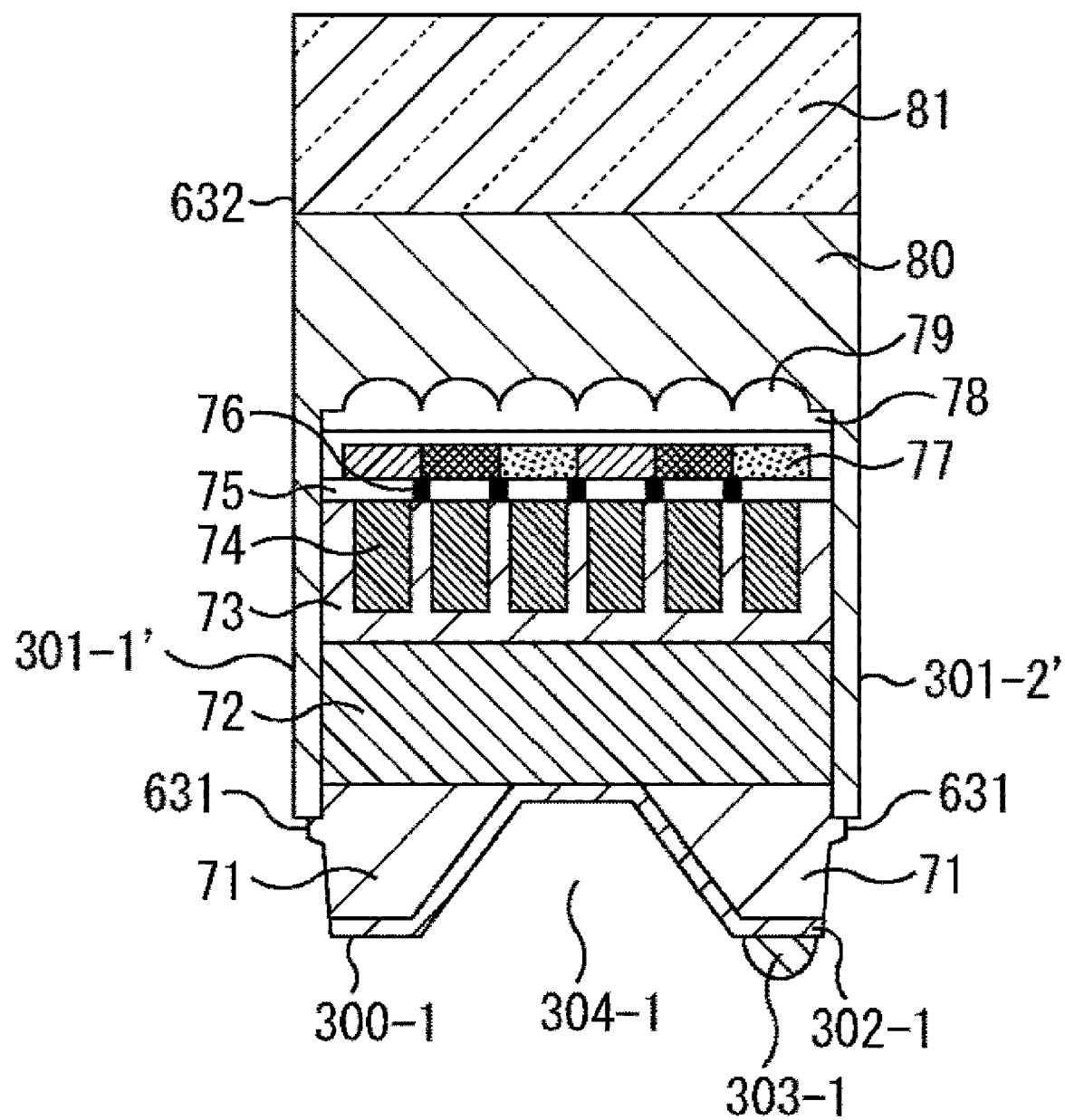
FIG. 23 is an illustrative diagram showing a configuration of a chip which is segmented by the stealth dicing.

The chip 300 illustrated in FIG. 23 has the same configuration as the chip 300 illustrated in FIG. 11, but both chips are different in that a part of the crack formed in the stealth dicing is left in the support substrate 71. The side wall of the support substrate 71 of the chip 300 includes a side wall formed by the blade dicing and a side wall formed by the stealth dicing. In various embodiments, a roughness of the side wall formed by blade dicing is different than a roughness of the side wall formed by stealth dicing. For example, the side wall formed by stealth dicing (e.g., the portion of the support substrate 71 cut by stealth dicing) is rougher than the side wall formed by blade dicing. Also, the side wall formed by blade dicing is flatter and smoother than the side wall formed by stealth dicing (e.g., the side wall formed by blade dicing has a flatter, more uniform or smoother edge in the depth direction, and in contrast the side wall formed by stealth dicing has an uneven surface or an uneven edge in the depth direction). Further, the stealth dicing may form a crack advance portion in an area of the stealth diced portion such that a crack forms as a result of the stealth dicing and advances or spreads within the support substrate. In various embodiments, the crack advance portion and an area surrounding the crack advance portion may include a discolored portion from the heat of the laser irradiation. The crack advance portion may extend in a depth direction of the support substrate. The crack advance portion and/or the discolored portion may extend to the blade diced portion within the support substrate or throughout the support substrate. Still further, regarding FIG. 23, since the side walls do not include the modified layer 631, detached particles from the modified layer 631 are not generated and thus imaging failure is not caused.

The segmentation is performed in the above-mentioned flow, but the steps may be changed. For example, the stealth dicing process (steps S652 to S654) may be performed before step S651. The support substrate 71 is divided by appropriately including the stretching process of the stealth dicing in the illustrative above-mentioned processes. The segmentation may be performed by the stretching process of the stealth dicing.

In this way, the grooves may be formed in the support substrate 71 by the stealth dicing. When this processing is performed, the scribed portions 91 of the chips 300 and 400 are filled with a resin and it is thus possible to prevent or reduce occurrence of a crack at the time of processing.

<Electronic Apparatus>

The presently disclosed technology is not limited to application to an imaging apparatus, but can be applied to all electronic apparatuses using an imaging apparatus as an image input portion (e.g., photoelectric conversion portion), such as an imaging apparatus such as a digital still camera or a video camera, a portable terminal apparatus having an imaging function such as a mobile phone, and a copying machine using an imaging apparatus as an image reading unit, among others. Also, a module type mounted on an electronic apparatus, that is, a camera module, may employ the imaging apparatus.

Figure 24:
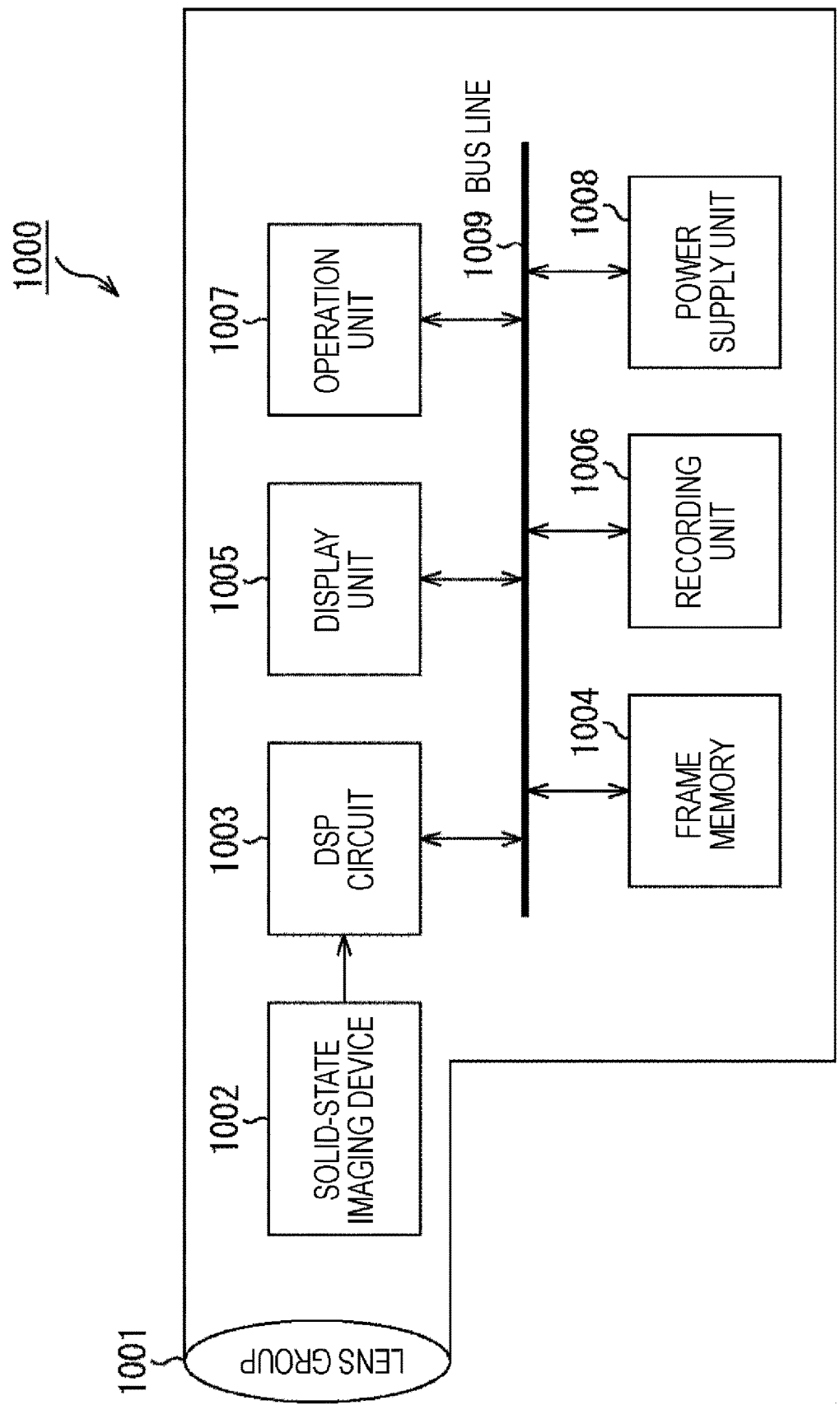
FIG. 24 is an illustrative diagram showing a configuration of an electronic apparatus.

FIG. 24 is a block diagram illustratively showing a configuration example of an imaging apparatus which is an example of the electronic apparatus according to embodiments of the present disclosure. As illustrated in FIG. 24, the imaging apparatus 1000 according to embodiments of the present disclosure includes an optical unit including a lens group 1001 or the like, a solid-state imaging device 1002, a DSP circuit 1003 which is a camera signal processing unit, a frame memory 1004, a display unit 1005, a recording unit 1006, an operation unit 1007, and a power supply unit 1008.

The DSP circuit 1003, the frame memory 1004, the display unit 1005, the recording unit 1006, the operation unit 1007, and the power supply unit 1008 are connected to each other via a bus line 1009.

The lens group 1001 receives incident light (e.g., image light) from a subject and focuses the incident light on an imaging plane of the solid-state imaging device 1002. The solid-state imaging device 1002 converts light intensity of incident light focused on the imaging plane by the lens group 1001 into electrical signals by pixels and outputs pixel signals. The imaging device according to the above-mentioned embodiments can be used as the solid-state imaging device 1002.

The display unit 1005 includes a panel type display device such as a liquid crystal display device or an organic electroluminescence (EL) display device and displays a moving image or a still image captured by the solid-state imaging device 1002. The recording unit 1006 records the moving image or the still image captured by the solid-state imaging device 1002 on a recording medium such as a digital versatile disk (DVD).

The operation unit 1007 issues operation commands for various functions of the imaging apparatus under a user's operation. The power supply unit 1008 appropriately supplies a variety of power as operating power of the DSP circuit 1003, the frame memory 1004, the display unit 1005, the recording unit 1006, and the operation unit 1007 to the supply objects.

The imaging apparatus 1000 is applied to a video camera, a digital camera, or a camera module of a mobile apparatus such as a mobile phone. In the imaging apparatus 1000, the solid-state imaging device according to the above-mentioned embodiments can be used as the solid-state imaging device 1002.

The technology according to embodiments of the present disclosure may be applied to various electronic apparatuses including products. For example, the technology according to embodiments of the present disclosure may be applied to an internal information acquisition system for a patient, which uses an endoscopic capsule.

Figure 25:
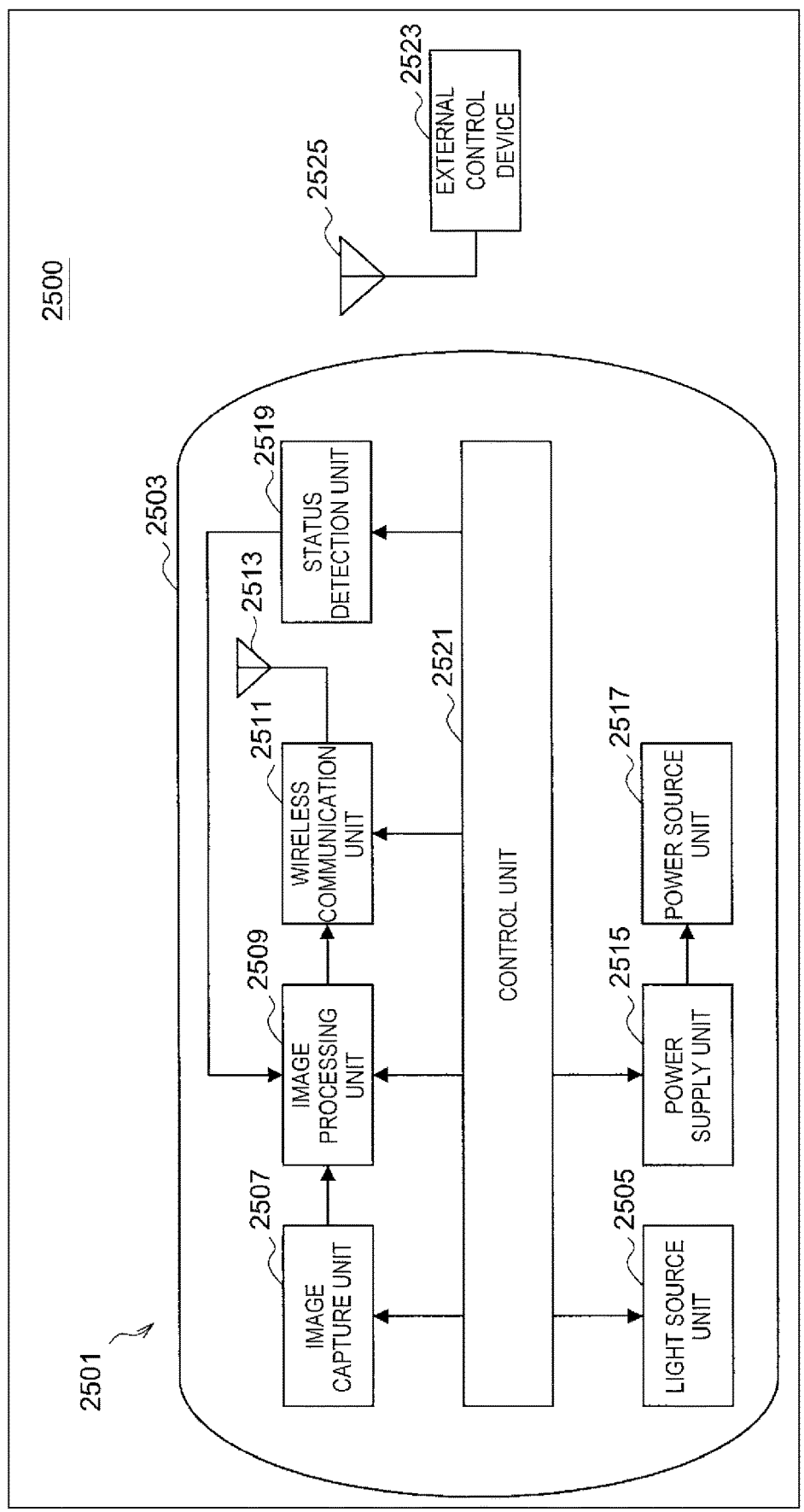
FIG. 25 is an illustrative block diagram showing an example of a schematic configuration of an internal information acquisition system to which embodiments of the present disclosure are applied.

FIG. 25 is an illustrative diagram showing an example of a schematic configuration of an internal information acquisition system 2500 to which the technology according to embodiments of the present disclosure may be applied. Referring to FIG. 25, the internal information acquisition system 2500 includes an endoscopic capsule 2501, and an external control device 2523 that centrally controls the operation of the internal information acquisition system 2500. The endoscopic capsule 2501 is swallowed by a patient in an examination. The endoscopic capsule 2501 has an image capture function and a wireless communication function. The endoscopic capsule 2501 moves through the interior of organs such as the stomach and the intestines by peristaltic movement or the like, for example, until being excreted naturally from the patient, while also successively capturing images (hereinafter also called internal images) of the interior of the relevant organs at predetermined intervals, and successively wirelessly transmitting information about the internal images to the external control device 2523 outside the body. Based on the received information about the internal images, the external control device 2523 generates image data for displaying the internal images on a display device (not illustrated). In this way, with the internal information acquisition system 2500, images depicting the patient's internal conditions can be obtained continually from the time the endoscopic capsule 2501 is swallowed to the time the endoscopic capsule 2501 is excreted.

The configurations and functions of the endoscopic capsule 2501 and the external control device 2523 will be described in further detail. As illustrated in FIG. 25, the endoscopic capsule 2501 has the functions of a light source unit 2505, an image capture unit 2507, an image processing unit 2509, a wireless communication unit 2511, a power supply unit 2515, a power source unit 2517, a status detection unit 2519, and a control unit 2521 built in a capsule-shaped housing 2503.

The light source unit 2505 includes a light source such as a light-emitting diode (LED), for example, and irradiates the imaging field of the image capture unit 2507 with light.

The image capture unit 2507 includes an image sensor, such as the image sensors disclosed herein, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 2507 is provided to the image processing unit 2509. Advantageous of the image sensors disclosed herein may also be advantageous when used with such an internal information acquisition system 2500. For example, the reduced thickness of the image sensors disclosed herein may advantageously reduce the size of the endoscopic capsule 2501.

The image processing unit 2509 includes a processor such as a central processing unit (CPU) or a graphics processing unit (GPU), and performs various types of signal processing on the image signal generated by the image capture unit 2507. This signal processing may be a minimal level of processing (such as image data compression, frame rate conversion, data rate conversion, and/or format conversion, for example) for transmitting the image signal to the external control device 2523. Configuring the image processing unit 2509 to, for example, perform only a minimal necessary level of processing makes it possible to realize the image processing unit 2509 in a more compact form with lower power consumption, which may be advantageous for the endoscopic capsule 2501. However, if there is extra space or available power inside the housing 2503, additional signal processing (such as a noise removal process or other image quality-improving processes, for example) may also be performed by the image processing unit 2509. The image processing unit 2509 provides the image signal subjected to the signal processing to the wireless communication unit 2511 as raw data. Note that if information about the status (such as movement or orientation) of the endoscopic capsule 2501 is acquired by the status detection unit 2519, the image processing unit 2509 may also provide the image signal to the wireless communication unit 2511 in association with the information. This makes it possible to associate the position inside the body where an image is captured, the direction in which the image is captured, and other information with the captured image.

The wireless communication unit 2511 includes a communication device capable of transmitting and receiving various types of information to and from the external control device 2523. This communication device includes, for example, an antenna 2513 and a processing circuit that performs processing such as modulation processing for transmitting and receiving signals. The wireless communication unit 2511 performs predetermined processing such as modulation processing on the image signal that was subjected to the signal processing by the image processing unit 2509, and transmits the image signal to the external control device 2523 via the antenna 2513. In addition, the wireless communication unit 2511 receives, from the external control device 2523 via the antenna 2513, a control signal related to driving control of the endoscopic capsule 2501. The wireless communication unit 2511 provides the received control signal to the control unit 2521.

The power supply unit 2515 includes, for example, an antenna coil for receiving power, a power regeneration circuit for regenerating power from a current produced in the antenna coil, and a voltage step-up circuit. In the power supply unit 2515, the principle of what is called contactless or wireless charging is used to generate power. For example, an external magnetic field (electromagnetic wave) of a predetermined frequency provided to the antenna coil of the power supply unit 2515 produces an induced electromotive force in the antenna coil. This electromagnetic wave may be a carrier wave transmitted from the external control device 2523 via an antenna 2525, for example. Power is regenerated from the induced electromotive force by the power regeneration circuit, and the electric potential of the power is suitably adjusted in the voltage step-up circuit, thereby generating power for power storage. The power generated by the power supply unit 2515 is stored in the power source unit 2517.

The power source unit 2517 includes a secondary battery, and stores power generated by the power supply unit 2515. FIG. 25 omits arrows or the like indicating the recipients of power from the power source unit 2517 for brevity, but power stored in the power source unit 2517 is supplied to the light source unit 2505, the image capture unit 2507, the image processing unit 2509, the wireless communication unit 2511, the status detection unit 2515, and the control unit 2521, and may be used to drive these components.

The status detection unit 2519 includes a sensor such as an acceleration sensor and/or a gyro sensor for detecting the status of the endoscopic capsule 2501. The status detection unit 2519 can acquire information about the status of the endoscopic capsule 2501 from detection results from the sensor. The status detection unit 2519 provides the acquired information about the status of the endoscopic capsule 2501 to the image processing unit 2509. As discussed earlier, in the image processing unit 2509, the information about the status of the endoscopic capsule 2501 may be associated with the image signal.

The control unit 2521 includes a processor such as a central processing unit (CPU), and centrally controls the operation of the endoscopic capsule 2501 by operating in accordance with a predetermined program. The control unit 2521 appropriately controls the driving of the light source unit 2505, the image capture unit 2507, the image processing unit 2509, the wireless communication unit 2511, the power supply unit 2515, the power source unit 2517, and the status detection unit 2519 in accordance with a control signal transmitted from the external control device 2523, thereby realizing the function of each component as described above.

The external control device 2523 may be a processor such as a CPU or GPU, or a device such as a microcontroller or a control board on which a processor and a storage element such as memory are mounted. The external control device 2523 includes the antenna 2525, and is capable of transmitting and receiving various types of information to and from the endoscopic capsule 2501 via the antenna 2525. For example, the external control device 2523 controls the operation of the endoscopic capsule 2501 by transmitting a control signal to the control unit 2521 of the endoscopic capsule 2501. For example, a light irradiation condition under which the light source unit 2505 irradiates a target of observation with light may be changed by a control signal from the external control device 2523. In addition, an image capture condition (such as the frame rate and the exposure level in the image capture unit 2507, for example) may be changed by a control signal from the external control device 2523. In addition, the content of processing in the image processing unit 2509 and a condition (such as the transmission interval and the number of images to transmit, for example) under which the wireless communication unit 2511 transmits the image signal may be changed by a control signal from the external control device 2523.

In addition, the external control device 2523 performs various types of image processing on the image signal transmitted from the endoscopic capsule 2501, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 2523 controls the driving of a display device (not illustrated), and causes the display device to display a captured internal image on the basis of the generated image data. Alternatively, the external control device 2523 may also cause a recording device (not illustrated) to record the generated image data, or cause a printing device (not illustrated) to make a printout of the generated image data.

The above describes an example of the internal information acquisition system 2500 to which the technology according to embodiments of the present disclosure may be applied.

In this specification, a system refers to an entire apparatus including a plurality of devices.

The advantageous effects described in this specification are merely exemplary but are not restrictive, and other advantageous effects may be achieved.

The embodiments of the presently disclosed technology are not limited to the above-mentioned embodiments but can be modified in various forms without departing from the gist of the presently disclosed technology.

The present technology can have the following configurations.

(1) A semiconductor device, including: a first substrate; and a second substrate adjacent to the first substrate, where a side wall of the second substrate includes a blade diced portion and a stealth diced portion.

(2) The semiconductor device according to (1), where the first substrate is disposed between a transparent layer and the second substrate.

(3) The semiconductor device according to any of (1) to (2), further including an adhesive layer between the first substrate and the transparent layer.

(4) The semiconductor device according to any of (1) to (3), further including a groove that extends from the adhesive layer to the second substrate.

(5) The semiconductor device according to any of (1) to (4), where the transparent layer is a cover glass layer and the adhesive layer is resin.

(6) The semiconductor device according to any of (1) to (5), where the stealth diced portion and the blade diced portion extend to the groove.

(7) The semiconductor device according to any of (1) to (6), where the stealth diced portion is further from the groove than the blade diced portion.

(8) An imaging device, including: a first substrate; a transparent layer; an adhesive layer between the first substrate and the transparent layer; a second substrate, where the first substrate is disposed between the adhesive layer and the second substrate; and a groove extending from the adhesive layer to the second substrate, where the groove is filled with the adhesive layer.

(9) The imaging device according to (8), where the adhesive layer is a resin.

(10) The imaging device according to any of (8) to (9), where the transparent layer is a cover glass layer.

(11) The imaging device according to any of (8) to (10), further including a microlens layer and a wiring layer, where the groove extends through the microlens layer and through the wiring layer such that the adhesive layer is in contact with the microlens layer, the wiring layer, and the first substrate.

(12) The imaging device according to any of (8) to (11), where a side wall of the second substrate includes a blade diced portion, and where a width of the groove is greater than a width of a blade in contact with the blade diced portion.

(13) The imaging device according to any of (8) to (12), further including a solder resist disposed on a bottom of the second substrate.

(14) An imaging device, including: a transparent layer; a first substrate, the first substrate including photoelectric conversion sections; a second substrate, where the first substrate is disposed between the transparent layer and the second substrate; and a microlens layer including microlenses that focus incident light to the photoelectric conversion sections, where the second substrate includes a first diced portion and a second diced portion.

(15) The imaging device according to (14), further including an adhesive layer between the first substrate and the transparent layer.

(16) The imaging device according to any of (14) to (15), further including a groove that extends from the adhesive layer to the second substrate, where the groove is filled with the adhesive layer.

(17) The imaging device according to any of (14) to (16), further including a wiring layer, where the groove extends through the microlens layer and through the wiring layer.

(18) The imaging device according to any of (14) to (17), where the groove extends such that the adhesive layer is in contact with the microlens layer, the wiring layer, and the first substrate.

(19) The imaging device according to any of (14) to (18), where the adhesive layer is a resin.

(20) The imaging device according to any of (14) to (19), where a width of the groove is greater than a width of a blade that is in contact with the first diced portion and the second diced portion.

The invention claimed is:

1. An imaging device, comprising:
    a first substrate;
    a transparent layer;
    an adhesive layer between the first substrate and the transparent layer;
    a second substrate, wherein the first substrate is disposed between the adhesive layer and the second substrate; and
    a groove extending from the adhesive layer to the second substrate, wherein the groove is filled with the adhesive layer.

2. The imaging device according to claim 1, wherein the adhesive layer is a resin.

3. The imaging device according to claim 1, wherein the transparent layer is a cover glass layer.

4. The imaging device according to claim 1, further comprising a microlens layer and a wiring layer, wherein the groove extends through the microlens layer and through the wiring layer such that the adhesive layer is in contact with the microlens layer, the wiring layer, and the first substrate.

5. The imaging device according to claim 1, wherein a side wall of the second substrate comprises a blade diced portion, and wherein a width of the groove is greater than a width of a blade in contact with the blade diced portion.

6. The imaging device according to claim 1, further comprising a solder resist disposed on a bottom of the second substrate.

7. An imaging device, comprising:
    a transparent layer;
    a first substrate, the first substrate including photoelectric conversion sections;
    a second substrate,
    wherein the first substrate is disposed between the transparent layer and the second substrate;
    a microlens layer comprising microlenses that focus incident light to the photoelectric conversion sections;
    an adhesive layer between the first substrate and the transparent layer; and
    a groove that extends from the adhesive layer to the second substrate,
    wherein the groove is filled with the adhesive layer, and
    wherein the second substrate comprises a first diced portion and a second diced portion.

8. The imaging device according to claim 7, further comprising a wiring layer, wherein the groove extends through the microlens layer and through the wiring layer.

9. The imaging device according to claim 8, wherein the groove extends such that the adhesive layer is in contact with the microlens layer, the wiring layer, and the first substrate.

10. The imaging device according to claim 7, wherein the adhesive layer is a resin.

11. The imaging device according to claim 7, wherein a width of the groove is greater than a width of a blade that is in contact with the first diced portion and the second diced portion.

* * * * *